United States Patent
Luo et al.

(10) Patent No.: US 6,884,464 B2
(45) Date of Patent: Apr. 26, 2005

(54) METHODS FOR FORMING SILICON COMPRISING FILMS USING HEXACHLORODISILANE IN A SINGLE-WAFER DEPOSION CHAMBER

(75) Inventors: Lee Luo, Fremont, CA (US); R. Suryanarayanan Iyer, Santa Clara, CA (US); Janardhanan Anand Subramony, Santa Clara, CA (US); Errol Antonio C. Sanchez, Dublin, CA (US); Xiaoliang Jin, San Jose, CA (US); Aihua Chen, San Jose, CA (US); Chang-Lian Yan, Chiba-Ken (JP); Nobuo Tokai, Chiba (JP); Yuji Maeda, Chiba (JP); Randhir P. Singh Thakur, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 133 days.

(21) Appl. No.: 10/288,358

(22) Filed: Nov. 4, 2002

(65) Prior Publication Data
US 2004/0086640 A1 May 6, 2004

(51) Int. Cl.[7] .............................................. C23C 16/22
(52) U.S. Cl. ............................ 427/255.29; 427/255.37; 427/255.393; 427/255.395; 427/294; 427/314; 427/372.2
(58) Field of Search .......................... 427/294, 255.29, 427/255.37, 255.393, 255.395, 314, 372.2

(56) References Cited

U.S. PATENT DOCUMENTS

| | | | |
|---|---|---|---|
| 5,766,342 A | * | 6/1998 | Shibuya et al. ............... 117/54 |
| 6,268,299 B1 | * | 7/2001 | Jammy et al. ............. 438/791 |
| 6,284,583 B1 | | 9/2001 | Saida et al. |
| 6,333,547 B1 | | 12/2001 | Tanaka et al. |

* cited by examiner

Primary Examiner—Timothy Meeks
(74) Attorney, Agent, or Firm—Blakely Sokoloff Taylor & Zafman

(57) ABSTRACT

A silicon comprising film and its method of fabrication is described. The silicon comprising film is grown on a substrate. A hexachlorodisilane (HCD) source gas is one of the reactant species used to form the silicon comprising film. The silicon comprising film is formed under a pressure between 10 Torr and 350 Torr.

20 Claims, 12 Drawing Sheets

METHODS FOR FORMING SILICON COMPRISING FILMS USING HEXACHLORODISILANE IN A SINGLE-WAFER DEPOSION CHAMBER

BACKGROUND OF THE INVENTION

1. Field of the Invention

The present invention relates to forming silicon comprising films for semiconductor devices and more specifically to forming the silicon comprising films using hexachlorodisilane as a precursor in a single-wafer deposition chamber.

2. Discussion of Related Art

Chemical vapor deposition (CVD) have been widely used to form silicon comprising films such as silicon oxide, silicon nitride, and silicon oxynitride. These films have wide applications in fabrication of integrated circuits such as transistors, microprocessors, and memories. These films are used as spacers, as etch stops, as diffusion and implantation masks, as capacitors, as dielectrics, as anti-reflection coatings, and as final passivation layers. Acceptable processes for making the silicon comprising films include those that form films with uniform thickness, uniform composition, low particulates, low chemical contamination, good adhesion to the substrate, and high throughput for manufacturing.

In a CVD process, given reactant gases such as silane and disilane are introduced into a reaction chamber at particular flow rates. The reactant gases are then decomposed. The intermediate elements from the decomposed gases react together at or near the surface of the heated substrate to form a film (e.g., a silicon oxide film). The gaseous by-products of the reaction are desorbed and removed from the reaction chamber. Energy to drive the reactions can be supplied by several methods, for example by thermal processing, by photons excitation, or by plasma excitation. In a LPCVD (low pressure CVD) process, oxide films are formed using a method and system much like the CVD except the films are formed at a reduced pressure and increased temperature. A conventional CVD or LPCVD system typically contains gas sources, gas feed lines, mass-flow controllers, a reaction chamber, and a heating assembly for heating substrates onto which, the film is deposited.

Silane or disilane chemistry has been widely used as precursors in the CVD or LPCVD processes to make silicon comprising films. With the degree of integration and density of the components to be fabricated onto a semiconductor device, it is important to form the silicon comprising films such as silicon oxide and silicon nitride with good step coverages and good uniformities. As is known, a step coverage refers to the thickness ratio of the film that is formed over the bottom or side to the top of a particular structure (usually a step or a trench) present on a substrate. A good step coverage indicates that this ratio is close to or equal to 1:1. However, with many intricate, dense and complex structures of the components to be formed on the semiconductor device, it is becoming difficult to form uniform films with good step coverage using the current silane and disilane chemistry. Alternative chemistry to the silane and disilane chemistry has been actively sought after. Hexachlorodisilane ($Si_2Cl_6$) is one such alternative chemistry. One disadvantage of current methods that utilize the hexachlorodisilane chemistry to form a silicon comprising film includes excessive by-product particle contamination that requires unnecessary and complicated cleaning as well as complicated efficient/exhaust management. Another disadvantage includes slow deposition rate. Further yet, current methods utilize batch processing type of chambers, which limit the rate of customizing and controlling film properties for any particular product.

SUMMARY OF THE INVENTION

A process for forming a silicon comprising film such as a silicon oxide film, a silicon nitride film, or a silicon oxynitride film, is described. The films are grown by a thermal chemical vapor deposition process. The process is performed in a single-wafer deposition chamber. In the deposition chamber, a hexachlorodisilane source gas is mixed with an oxidation source gas such as nitrous oxide ($NO_2$) to form a silicon oxide film. Alternatively, the hexachlorodisilane source gas is mixed with a nitridation source gas such as ammonia ($NH_3$) to form a silicon nitride film. Alternatively, the hexachlorodisilane source gas is mixed with an oxidation source gas such as nitrous oxide ($NO_2$) and a nitridation source gas such as ammonia ($NH_3$) to form a silicon-oxynitride film. The films are formed in the chamber with a total pressure between 10 to 350 Torr and with a temperature ranging from 500° C.–800° C. The films formed using hexachlorodisilane under the mentioned parameters have thicknesses less than 3000 Å and greater than 10 Å. And, the films are formed with deposition rates between 45 Å/minute to 2000 Å/minute.

BRIEF DESCRIPTION OF THE DRAWINGS

The present invention is illustrated by way of examples and not limitations in the figures of the accompanying drawings, in which like references indicate similar elements and in which.

DETAILED DESCRIPTION OF THE PRESENT INVENTION

The present invention is a novel method of forming a silicon comprising film in a single-wafer deposition chamber using hexachlorodisilane precursor. In the following description, for purposes of explanation, numerous specific details are set forth in order to provide a thorough understanding of the present invention. It will be evident, however, to one skilled in the art that the present invention may be practiced without these specific details. In other instances, specific apparatus structures and methods have not been described so as not to obscure the present invention. The following description and drawings are illustrative of the invention and are not to be construed as limiting the invention.

Hexachlorodisilane is sometimes abbreviated as "HCD" throughout this discussion.

The following sections describe novel methods of forming silicon comprising film using HCD precursor in a single-wafer deposition chamber. The single-wafer deposition chamber can be a cold-wall chamber. The single-wafer deposition chamber includes an insulation or temperature-controlled liner. The precursor source gases are decomposed using a thermal energy source in the chamber to form the silicon comprising film. The silicon comprising film is formed with a deposition temperature ranging from about 500° C. to about 800° C. and a deposition pressure ranging from about 10 Torr to about 350 Torr. The silicon comprising films formed using the exemplary methods of the present invention have thicknesses between 10 Å to 3000 Å. The silicon comprising films are formed with deposition rates between 45 Å/minute to 2000 Å/minute. The substrate having the silicon comprising film formed in the chamber is optionally annealed using a rapid thermal annealing process. Examples of the silicon comprising film include silicon nitride, silicon-oxynitride, silicon oxide, polycrystalline and amorphous silicon. The exemplary methods of forming the silicon comprising films of the present invention can be used to fabricate oxide-nitride-oxide (ONO) spacer, ONO stack for FLASH memory gate, liner oxide trench, or side wall spacer in a MOS transistor, used in semiconductor devices, to name a few.

Figure 1:
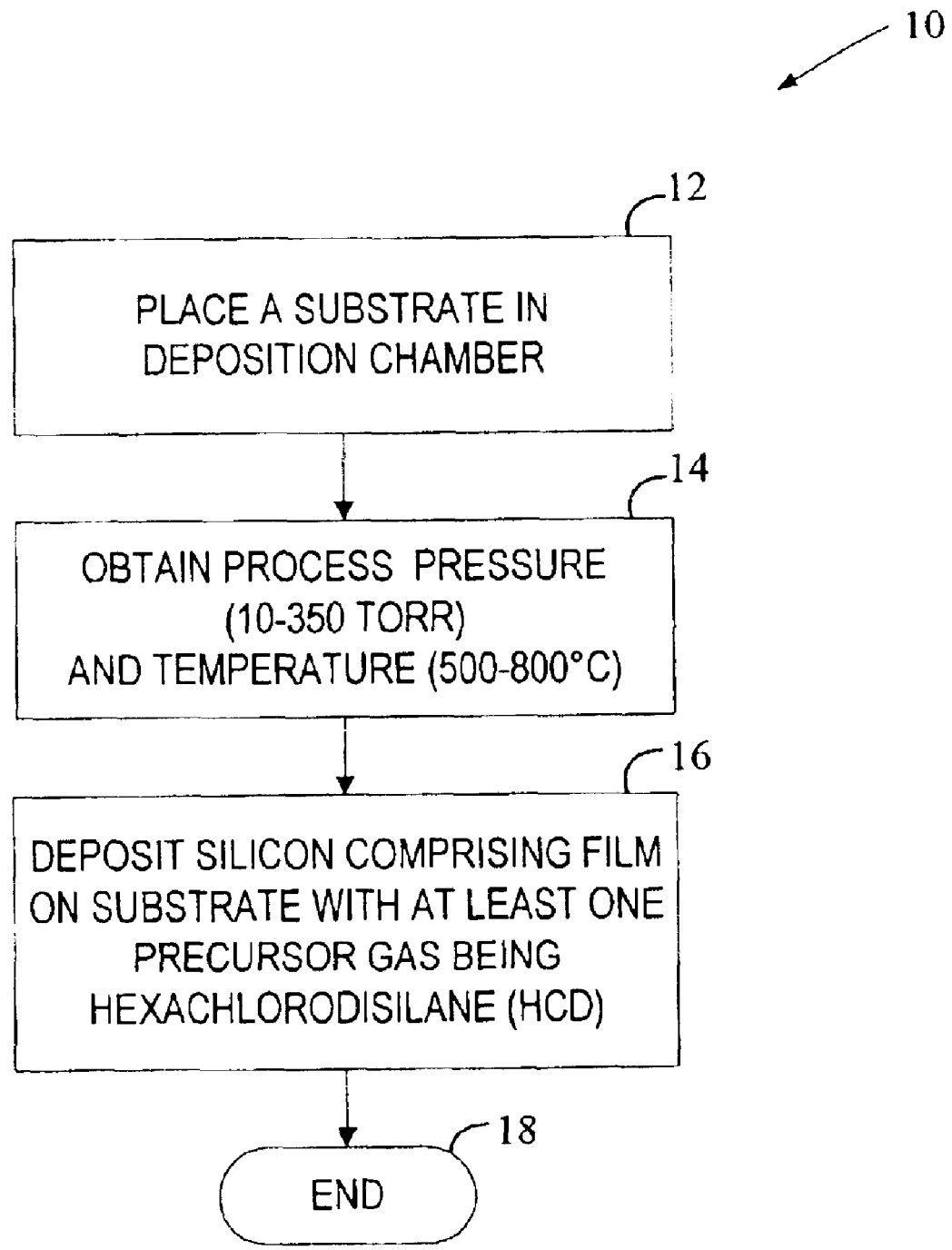
FIG. 1 illustrates an exemplary method of forming a silicon comprising film using hexachlorodisilane as a precursor gas to deposit the silicon comprising film in a single-wafer deposition chamber.

FIG. 1 illustrates the process flow of an exemplary method 10 for forming a silicon comprising film. As set forth at operation 12, a substrate to be processed is placed into a deposition reactor. The deposition reactor is a single-wafer deposition chamber (described below). An example of a suitable single-wafer deposition chamber apparatus is a resistively heated reactor illustrated in FIGS. 2A–2B and 3–5. Other suitable deposition reactors include the OxZgen™ reactor manufactured by Applied Materials, Inc.

At operation 14, the deposition chamber is set to a desired process temperature and a desired process pressure. In one exemplary embodiment, the process temperature is between from about 500° C. and 800° C. and the process pressure is between 10 Torr and 350 Torr.

At operation 16, a silicon comprising film is deposited on the substrate. Precursor source gases are introduced into the deposition chamber. One of the precursor source gases is hexacholordisilane (HCD), which is used as a silicon source gas. A carrier gas or a dilution gas such as nitrogen ($N_2$) is mixed with the HCD source gas prior to the introduction of the HCD source gas into the deposition chamber. In one embodiment, an oxidation source gas such as nitrogenous oxide ($N_2O$) is introduced into the deposition chamber. The mixture of the HCD source gas and the oxidation source gas is thermally decomposed to form a silicon oxide ($SiO_2$) film. In another example, a nitridation source gas such as ammonia ($NH_3$) and an oxidation source gas are introduced into the deposition chamber. The mixture of the HCD source gas, the nitridation source gas, and the oxidation source gas is thermally decomposed to form a silicon-oxynitride ($Si_xN_yO_z$) film. In yet another example, a nitridation source gas such as $NH_3$ is introduced into the deposition chamber and the oxidation source gas is cut off such that no oxidation source gas is present during the deposition process. The mixture of the HCD source gas and the nitridation source gas is thermally decomposed to form a silicon nitride ($Si_3N_4$) film. Prior to discussing in more details exemplary methods of making these various silicon comprising films, an exemplary single wafer deposition chamber that can be used for the making of these silicon comprising films is described below.

FIGS. 2A, 2B, 3, 4, and 5 illustrate different cross-sectional sideviews of a single wafer chemical vapor deposition chamber that can be used to practice exemplary embodiments of the present invention. For the purpose of illustration, a chamber of approximately in the range of 5–6 liters is described and which can be used to carry out the exemplary embodiments of the present invention.

Figure 2A:
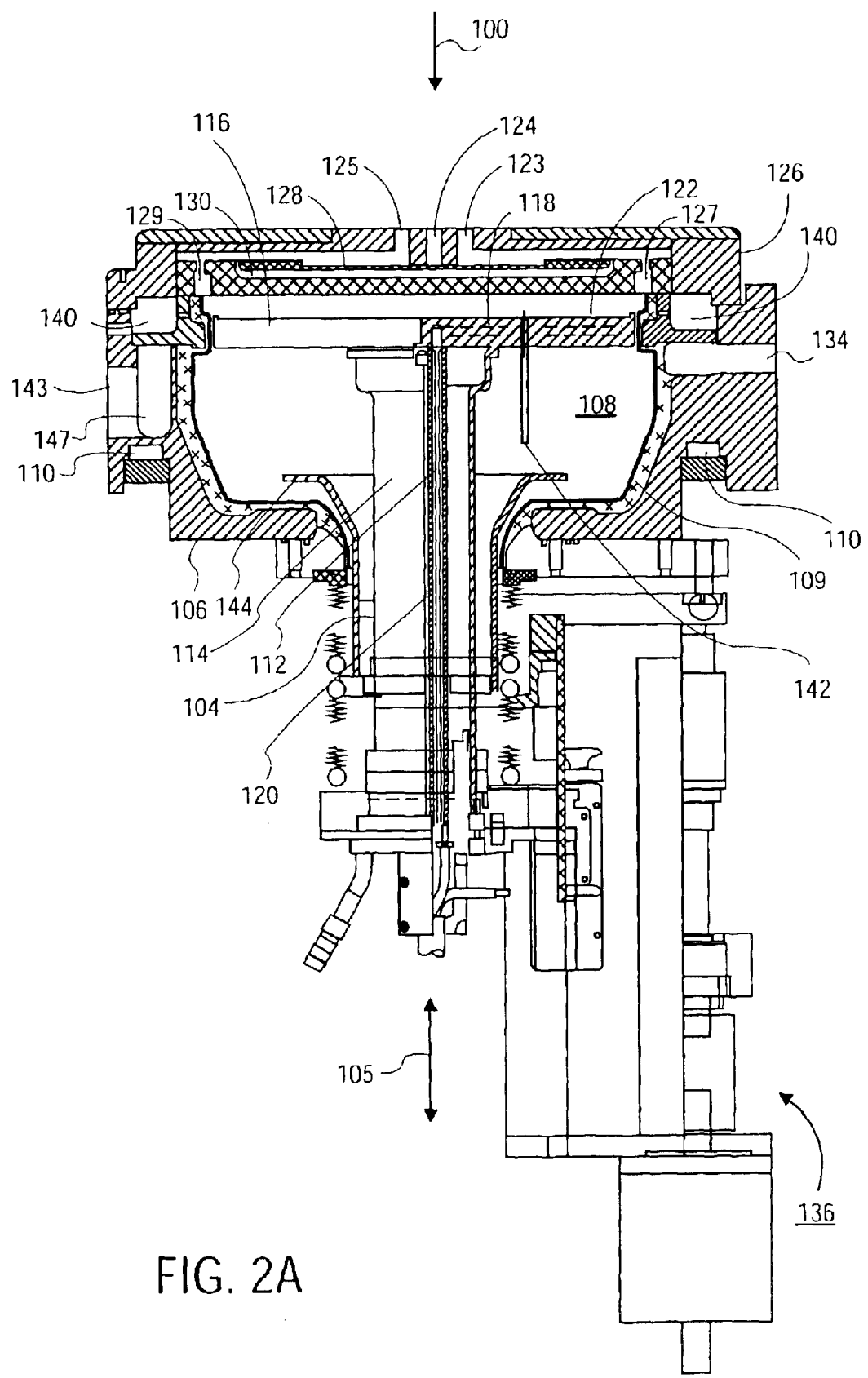
FIG. 2A illustrates a cross-sectional sideview of an exemplary single-wafer deposition chamber which can be used to form the silicon comprising film.

FIGS. 2A–2B and 3–5 illustrate a reactor vessel assembly (reactor) 100. FIG. 2A illustrates that the reactor 100 comprises a chamber body 106 that defines a reaction chamber 108 in which process gases, precursor gases, or reactant gases are thermally decomposed to form the silicon comprising film on a wafer substrate (not shown). The chamber body 106 is constructed of materials that will enable the chamber to sustain a pressure between 10 to about 350 Torr. In one exemplary embodiment, the chamber body 106 is constructed of an aluminum alloy material. The chamber body 106 includes passages 110 for a temperature controlled fluid to be pumped therethrough to cool the chamber body 106. Equipped with the temperature controlled fluid passages, the reactor 100 is referred to as a "cold-wall" reactor. Cooling the chamber body 106 prevents corrosion to the material that is used to form the chamber body 106 due to the presence of the reactive species and the high temperature.

Resident in the chamber body 106 are a reaction chamber 108, a chamber lid 126, several distribution ports (e.g., ports 123, 124 and 125), a faceplate (or shower head) 130, a blocker plate 128, and a resistive heating assembly 104. The resistive heating assembly 104 includes several heating elements (rods) 112 running the length of a heater tube 114 that is made of nickel. At the end of the heater tube 114 is a heating disk 116 made out of sintered AlN. Within the heating disk 116 is a spiral heating element (coil) 118 made out of molybdenum. The rods 112 and the coil 118 are joined by brazing and are electrically conductive therein. The rods 112 are thermally insulated with AlN ceramic sleeves 120. The coil 118 provides most of the electrical resistance and therefore most of the reaction chamber 108 heating. At the end of the heating disk 116 is a recess called a susceptor 122 and within the susceptor 122 is placed a wafer (not shown).

FIG. 2A illustrates that the chamber body 108 further houses a lifter assembly 136. The lifter assembly 136 facilitates the moving of the wafer substrate (not shown) in and out of the reaction chamber 108. The lifter assembly 136 can be a stepper motor. The lifter assembly 136 moves the heater assembly 104 up and down along an axis 105 to facilitate the moving of the wafer substrate in and out of the reaction chamber 108.

Figure 5:
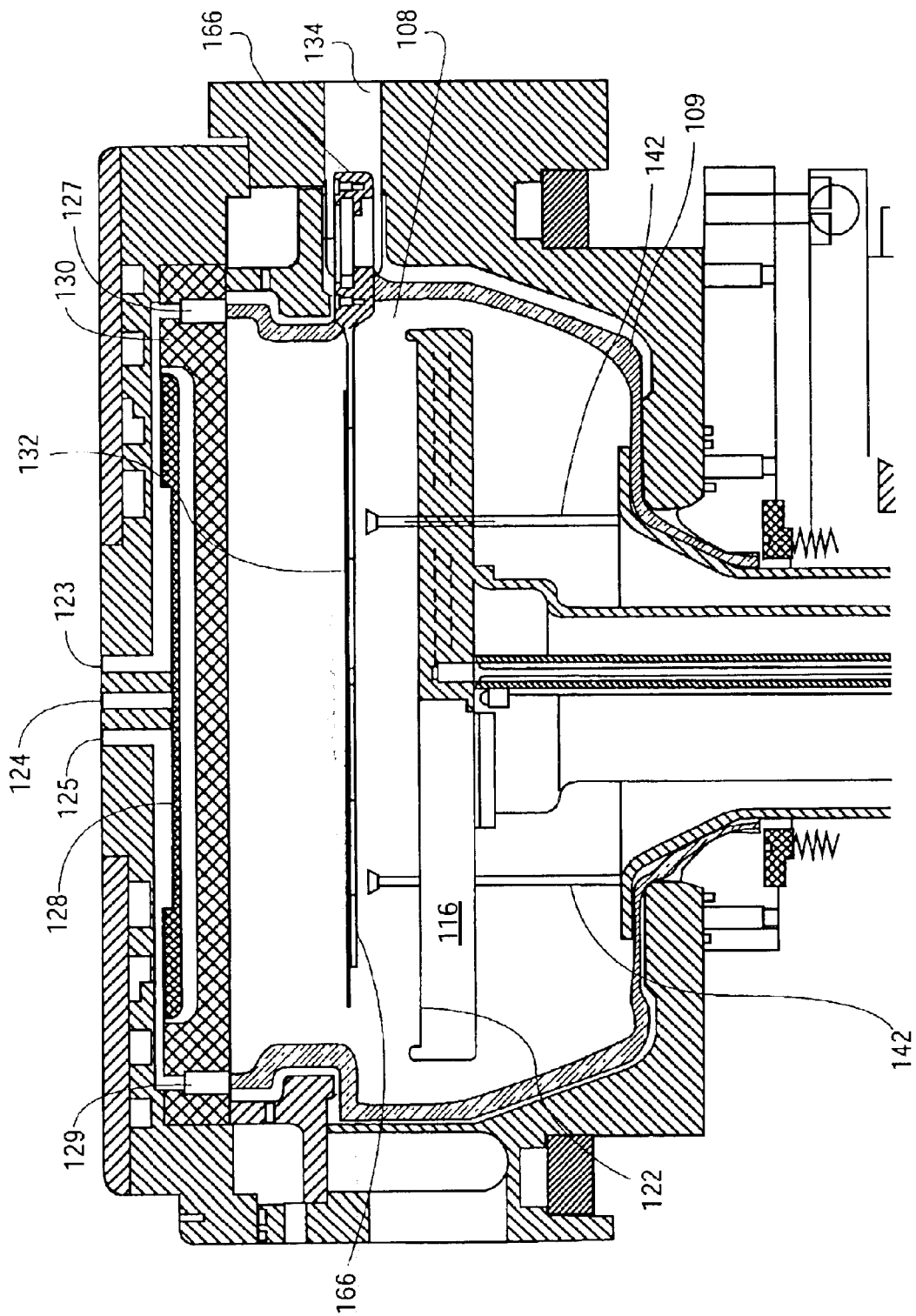

In one embodiment, FIG. 5 illustrates that a substrate 132 is placed into the reaction chamber 108 through the entry port 134 by for example, a robotic transfer mechanism (not shown). In one embodiment, the robotic transfer mechanism couples to a transfer blade 166 and the robotic transfer mechanism controls the transfer blade 166. The transfer blade 166 inserts the substrate 132 through the opening 134 to load the substrate 132 into the reaction chamber 108 within the susceptor 122. As the substrate 132 is being loaded, the lifter assembly 136 lowers the heater assembly 104 and the susceptor 122 in an inferior direction along the axis 105 so that the surface of the susceptor 122 is below the entry port 134. As the susceptor 122 is lowered, the substrate 132 is placed in the reaction chamber 108. Once the substrate 132 is loaded, the entry 134 is sealed and the lifter assembly 136 moves or advances the heater assembly 104 and the susceptor 122 in a superior (e.g., upward) direction toward the faceplate 130. In one exemplary embodiment, the advancement stops when the wafer substrate 132 is a short distance (e.g., 400–900 mils) from the faceplate 130.

In one exemplary embodiment, when ready for deposition or processing, process gases or precursor gases controlled by a gas panel (shown in FIG. 3) are independently introduced into the reaction chamber 108 through the ports 123, 124, and 125. The blocker plate 128 has a plurality of holes (not shown) to accommodate a gas flow therethrough. In one embodiment, a gas is fed to the blocker plate 128 from one of the ports 123, 124, and 125, e.g., the port 124.

Figure 2B:
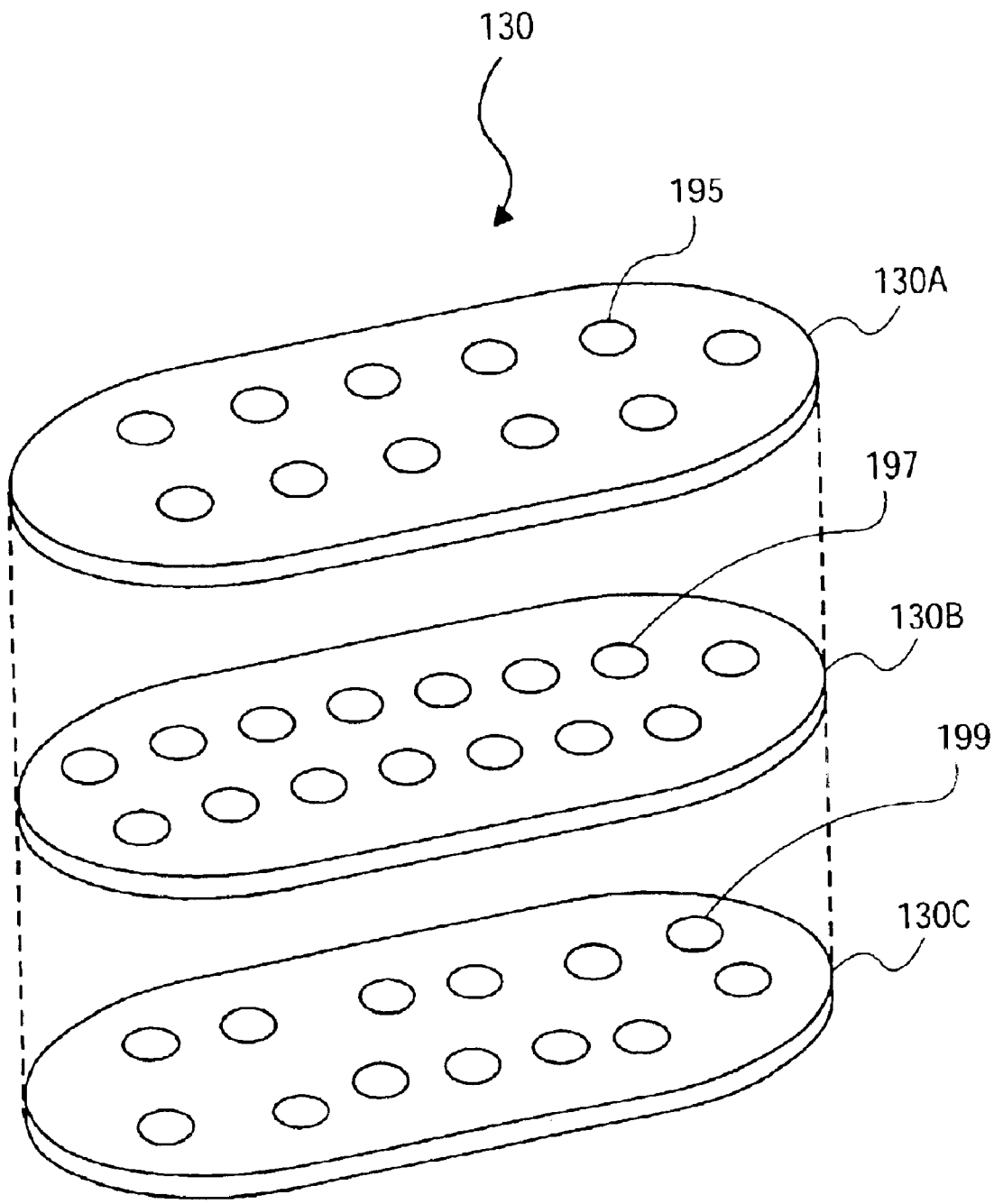
FIG. 2B illustrates an exploded view of a faceplate component of the single-wafer deposition chamber illustrated in FIG. 2A.

In one embodiment, a first gas is introduced into the reaction chamber 108 first through the port 124, through the blocker plate 128, and then through the faceplate 130. The first gas is distributed from the port 124 through the plurality of holes in the blocker plate 128 and then through the faceplate 130. The faceplate 130 uniformly distributes the first gas into the reaction chamber 108. In one embodiment, the faceplate 130 is further divided into three different layers, a first layer 130A, a second layer 130B, and a third layer 103C, as shown in FIG. 2B. Each of the layers 130A, 130B, and 130C, accommodates a flow of gas. The first layer 130A includes a first set of holes 195. The first gas flow from the blocker plate 128 is flown into the first layer 130A and distributed through the first set of holes 195 and into the reaction chamber 12. In one embodiment, a second gas is introduced into the reaction chamber first through the port 123. The port 123 continues to a passageway 127 that leads into the second layer 130B of the faceplate 130. The second gas is flown from the port 123, to the passageway 127, and into the second layer 130B of the faceplate 130. The second layer 130B includes a second set of holes 197 that distributes the second gas into the reaction chamber 12. In one embodiment, a third gas is introduced into the reaction chamber first through the port 125. The port 125 continues to a passageway 129 that leads into the third layer 130C of the faceplate 130. The third gas is flown from the port 125, to the passageway 129, and into the second layer 130C of the faceplate 130. The second layer 130B includes a third set of holes 199 that distributes the third gas into the reaction chamber 12.

As the process gases leave the faceplate 130, the process gases mix together to form a reactant gas mixture, which thermally decompose, and react together to form an appropriate film on the substrate 132. The film formed is a silicon comprising film wherein the composition of the film depends on the mixtures of the process gases.

In another exemplary embodiment, the process gasses are allowed to mix in the lid 126 at one of the ports 123, 124, and 125, e.g., the port 124. All of the process gases are introduced into the port 124. In one embodiment, the lid 126 may include a mixer (not shown) to mix the process gases that are introduced into the port 124. The mixed process gases are then flown flow from the blocker plate 128 into the first layer 130A and distributed through the first set of holes 195 and into the reaction chamber 12. In this case, the blocker plate 128 and the faceplate 130 need to be adequately heated to prevent formation of unwanted condensation particulate products. The mixed gases then flow into the reaction chamber 108, thermally decompose, and react to form an appropriate film on the substrate. The "upstream" mixing of the reactants in the lid 126 allows for better control of film uniformity on the substrate 132.

Figure 4:
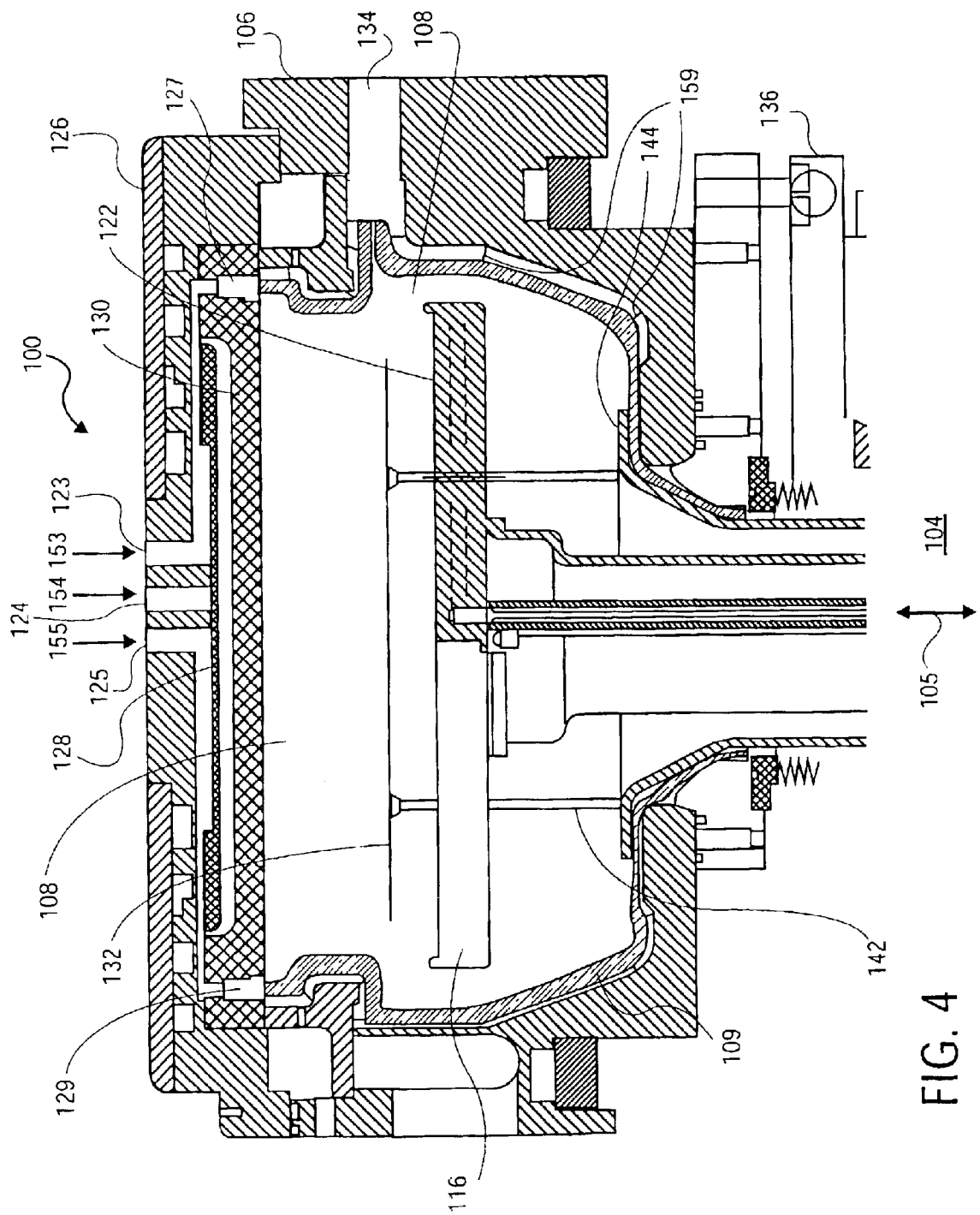
FIGS. 4–5 illustrates other cross-sectional sideviews of the deposition chamber.

The substrate 132 can be removed from the chamber 108 (for example, upon the completion of the deposition) first by being separated from the surface of the susceptor 122 as illustrated in FIGS. 4 and 5. The transfer blade 166 is inserted through the opening 134 beneath the heads of the lift pins 142 which support the substrate 132. The lift pins 142 are coupled to a contact lift plate 144 which can move the lift pins 142 up and down. Next, the lifter assembly 136 inferiorly moves (e.g., lowers) the heater assembly 104. As the heating assembly 104 moves in an inferior direction, through the action of the lifter assembly 136, the lift pins 142 remain stationary and ultimately, extend above the top surface of the heating disk 116 to separate the substrate 132 from the susceptor 122. The substrate 132 thus is put in contact with the transfer blade 166. The substrate 132 can then be removed through the entry port 134 by the transfer blade 166.

The mechanism described above may be repeated for subsequent substrates 132. A detailed description of one suitable lifter assembly 136 is described in U.S. Pat. No. 5,772,773, which is assigned to Applied Materials, Inc. of Santa Clara, Calif.

The reaction chamber 108 also includes a temperature indicator (not shown) to monitor the processing temperature inside the reaction chamber 108. In one example, the temperature indicator can be a thermocouple, which is positioned such that it conveniently provides data about the temperature at the surface of the susceptor 122 (or at the surface of a substrate 132 supported by the susceptor 122).

FIGS. 2A–2B and 3–5 further illustrate that the reaction chamber 108 is lined with a temperature-controlled liner or an insulation liner 109. As mentioned above, the chamber body 106 includes the passages 110 for a temperature controlled fluid to create the cold-wall chamber effect. The reaction temperature inside reaction chamber 108 can be as high as 800° C. or even more. With the chemistry that is used to form the film in the reaction chamber 108, high temperature will easily corrode the chamber body 106 of the reaction chamber 108. Hence, the chamber body 106 is equipped with the passages 110 for a temperature controlled fluid such as water or other coolant fluid that will cool the chamber body 106. This will prevent the chamber body 106 from getting too hot which will cause the chamber body 106 to be easily corroded. One problem that may associate with such a cold-wall chamber is that the areas inside the reaction chamber 108 that are in close proximity with the chamber's cold-wall tend to experience a sharp drop in temperature. The sharp drop in temperature in these areas encourages formation of condensation of particles that are undesirable or unfavorable for the silicon comprising films formed in the reaction chamber 108. For example, the reaction of HCD and $NH_3$ in a deposition process to form a silicon nitride ($Si_3N_4$) film typically causes the formation of $NH_4Cl$. $NH_4Cl$ is an undesirable salt by-product that requires cleaning to prevent contamination to the $Si_3N_4$ being formed. When the temperature drops below about 150° C., condensation such as $NH_4Cl$ will occur. These particles may become dislodged from the chamber wall. The dislodged particles form nucleation sites for particle formations on the wafer substrates. In one embodiment, the reaction chamber 108 is lined with the temperature-controlled line 109 to prevent the undesirable condensation of particles.

The temperature-controlled liner 109 helps maintain the temperature in the reaction chamber 108 at a certain level to prevent undesirable reaction due to the cold-wall effect of the chamber body 106. In one exemplary embodiment, the temperature-controlled liner 109 is a conduit through which a temperature-controlled fluid can be passed. In one embodiment, the temperature-controlled fluid must be able to maintain the temperature-controlled liner 109 at a temperature greater than 150° C., or alternatively, greater than 200° C. depending on the film forming application. In another embodiment, the temperature-controlled liner 109 is made out of a hard anodized aluminum that enables the temperature-controlled liner 109 to maintain a temperature greater than 150° C., or alternatively, greater than 200° C.

In one embodiment, the temperature-controlled liner 109 is coupled to the wall of the chamber body 106 such that the temperature-controlled liner 109 only has a few physical contacting points along the wall of the chamber body 106. (See for example, contacting points 159 illustrated in FIG. 4). Minimizing the physical contacts between the temperature-controlled liner 109 and the wall of the chamber body 106 minimizes heat loss to the chamber body 106 by minimizing conducting points.

In yet another embodiment, the temperature-controlled liner 109 is made out of a ceramic material of a type that can maintain a temperature greater than 150° C. or greater than 200° C. The temperature-controlled liner 109 can be made out of other suitable corrosion resistant materials. The hard anodized aluminum, the ceramic, or other suitable material that is used for the temperature-controlled liner 109 must be able to absorb the radiated heat from the heating assembly 104 and must not be too conductive so as to make the chamber body 106 hot by transferring the heat to the chamber body 106. In effect, the hard anodized aluminum, the ceramic, or other suitable material must insulate the heat and prevent it from being transferred to the cold wall of the chamber body 106.

Figure 3:
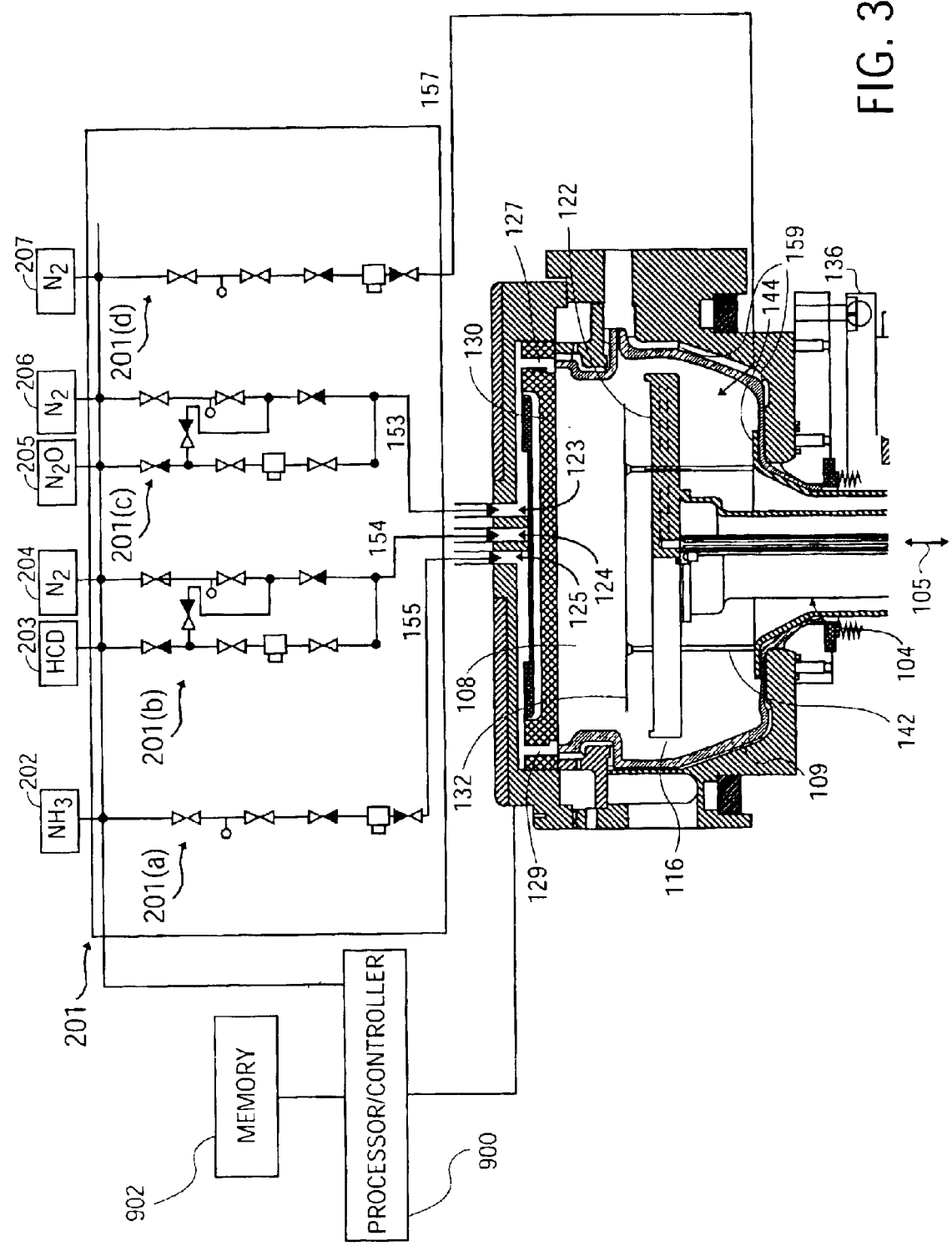
FIG. 3 illustrates another cross-sectional sideview of the exemplary single-wafer deposition chamber illustrated in FIG. 2A, which further includes a gas panel system.

In another exemplary embodiment, the reactor 100 further couples to a gas delivery system, which delivers reactant gases, stabilization gases or cleaning gases to the reaction chamber 108. FIG. 3 illustrates that in one example, the gas delivery system includes a gas panel system 201 which houses several manifolds, a manifold 201(a), a manifold 201(b), a manifold 201(c), and a manifold 201(d), each of which comprises gas lines for various gas sources that are injected into the reaction chamber 108. Gas sources are supplied into the gas panel system 201 through various gas cylinders or containers and gas lines. In one embodiment, gas sources 202–207 are coupled to the gas panel system 201 to supply gases into the manifolds. For example, the gas source 202 supplies $NH_3$ into the manifold 201(a); the gas source 203 supplies HCD into the manifold 201(b); and, the gas source 205 supplies $N_2O$ into the manifold 201(c). Additionally, each of the manifolds includes mass flow controllers (MFC) (not shown) that control the flow of the gas into the reaction chamber 108.

In another embodiment, the gas panel system 201 shown in FIG. 3 includes an additional manifold (not shown), which pneumatically controls cleaning gases that are injected into the reaction chamber 108 after deposition process. For instance, after deposition process or between runs, reaction chamber 108 is purged with the cleaning gases that are released from this manifold. In this embodiment, the manifold will include an exit line to direct the cleaning gases (e.g., argon, nitrogen trifluoride, and $N_2$) into the reaction chamber 108.

In one embodiment, the manifold 201(a) pneumatically controls the nitridation source gas (e.g., $NH_3$ and $N_2H_4$ (hydrazine)) injected into the reaction chamber 108. As illustrated in FIG. 3, the nitridation source gas may leave the manifold 201(a) and the gas panel system 201 to enter the reaction chamber 108. In one embodiment, the nitridation source gas 155 enters the reaction chamber 108 through the distribution port 125 that begins in a top surface of the chamber lid 126. The nitridation source gas 155 is fed through the passageway 129 into the third layer 130C of the faceplate 130. The third set of holes 199 in the third layer 130C allows for uniform distribution of the nitridation source gas 155 into the reaction chamber 108.

In another embodiment, the manifold 201(b) pneumatically controls the HCD source gas injected into the reaction chamber 108. The HCD source gas may be carried into the reaction chamber 108 by a carrier gas/dilution gas (e.g., nitrogen, hydrogen, helium, argon, and xenon). Unlike some of the current state of the art system, that uses HCD to form the silicon comprising film, the exemplary embodiments of this discussion involves a substantial amount of dilution gas.

In one exemplary embodiment, the dilution gas reduces the formation of the undesirable by-product particles. For example, the presence of the dilution gas reduces the formation of $NH_4Cl$ which is a by-product of the silicon nitride film forming process that uses the HCD and the $NH_3$ precursors. In other embodiments, the dilution gas reduces the residence time of the reactant species and thus, decreases the particulate formation. Additionally, the dilution gas increases pumping rates (or velocities) of the precursors, and thus, increases the uniformity of the film being formed. The dilution gas also facilitates even distribution of reactant gases above and closer to the surface of the substrate 132. Further yet, the dilution gas helps keep the overall gases cooler until they are in a very close proximity to the heated substrate 132.

There may be several gas lines supplying different gases into manifold 201(b) to allow the mixture of the HCD source gas with the carrier gas. In one embodiment, when the HCD source gas is carried by a carrier gas, these two gases are already mixed inside the manifold 201(b) and together they exit the manifold 201(b) and enter the reaction chamber 108. The HCD and the carrier gas forms a HCD gas mixture 154 (or HCD source gas 154 for short) which leaves the manifold 201(b) and the gas panel system 201 to enters the reaction chamber 108. In one embodiment, the HCD source gas 154 enters the reaction chamber 108 through the distribution port 124 that begins in a top surface of the chamber lid 126. The HCD source gas 154 is fed into the blocker plate 128 and into the first layer 130A of the faceplate 130. The first set of holes in the faceplate 130 allows for uniform distribution of the HCD source gas 154 into the reaction chamber 108.

In one embodiment, the manifold 201(c) pneumatically controls the oxidation source gases (e.g., nitrous oxide, and ozone) injected into the reaction chamber 108. The manifold 201(c) includes an exit line that directs the oxidation source gases into the reaction chamber 108. In one exemplary embodiment, the oxidation source gas is mixed with a carrier gas (e.g., $N_2$) to form an oxidation gas mixture 153 (or oxidation source gas 153 for short), which leaves the manifold 201(c) and the gas panel system 201 to enters the reaction chamber 108. In one embodiment, the oxidation source gas 153 enters the reaction chamber 108 through the distribution port 123 that begins in a top surface of the chamber lid 126. The oxidation source gas 153 is fed through the passageway 127 into the second layer 130B of the faceplate 130. The second set of holes 197 in the second layer 130B allows for uniform distribution of the oxidation source gas 153 into the reaction chamber 108.

The manifold 201(d) pneumatically controls bottom purge gas 157 (e.g., nitrogen) flown into the bottom of the reaction chamber 108 during deposition to prevent unwanted deposition.

The reactor 100 also couples to a pressure regulator or regulators (not shown). The pressure regulators establish and maintain pressure in the reaction chamber 108. Such pressure regulators are known in the field. The pressure regulator(s) that can be used for the exemplary embodiments must be able to maintain pressure at a level in the range of about 10 Torr to about 350 Torr. Alternatively, the reactor 100 may also be coupled to a gas pump-out system (not shown), which is well-known in the field to pump gases out of the reaction chamber 108. The gas pump-out system (which may include for example, throttle valve(s)) can also be used to control the pressure in the reaction chamber 108. The reactor 100 also couples to sensors (not shown), which monitor the processing pressure within the reaction chamber 108.

In one embodiment, a controller or processor/controller 900 is coupled to the chamber body 106 to receive signals from the sensors, which indicate the chamber pressure. The processor/controller 900 can also be coupled to the gas panel system 210. The processor 900 can work in conjunction with the pressure regulator or regulators to adjust or to maintain the desired pressure within the reaction chamber 108.

The materials for components in the reactor 100 are selected such that the exposed components must be compatible with high temperature processing of the present invention. The thermal decomposition of the precursors or the reactant species of the present invention to form the silicon comprising film involves temperature inside the reaction chamber 108 up to as high as 800° C. The materials for the components in the reactor 100 should be of the types that withstand such high temperature. In one embodiment, the chamber body 106 is made out of a corrosion resistant metal such as hard anodized aluminum. Such type of aluminum is often expensive. Alternatively, the chamber body 106 includes the passages 110 for a temperature-controlled fluid to be passed through. The passage of the temperature-controlled fluid enables the chamber body 106 to be made out of a very inexpensive aluminum alloy or other suitable metal since the passages 110 will keep the chamber body 106 cool. As mentioned, this is one of the reasons why the reactor 100 is often referred to as a cold-wall reactor. To prevent unwanted condensation on the cold-wall or the cooled chamber body 106, the temperature-controlled liner 109 described above can be made out a material that will absorbs the heat radiated from the reaction chamber 108 and keeps the temperature of the temperature-controlled liner 109 to at least about or greater than 150° C. or alternatively to at least about of greater than 200° C. depending on the film forming applications. In one embodiment, the temperature-controlled liner 109 needs to be maintained at a temperature that is sufficient to prevent unwanted condensation.

Additionally, the component materials should also be compatible with the process gases and other chemicals, such as cleaning chemicals and the precursors that may be introduced into the reaction chamber 108. In one embodiment, the exposed surfaces of the heating assembly 104 may be comprised of a variety of materials provided that the materials are compatible with the process. For example, the exemplary embodiments in this discussion require corrosive chemistry to be applied at high temperatures. The components of the heating assembly thus must withstand this environment. In one example, the components of the heating assembly are made out of a ceramic material such as aluminum nitride (AlN). The susceptor 122 of the heating assembly 104 may also be comprised of aluminum nitride material.

Furthermore, the faceplate 130 described above can be made out a material that will absorbs the heat radiated from the reaction chamber 108 and keeps the temperature of the faceplate 130 to at least about or greater than 150° C. or alternatively, to about or greater than 200° C. which is a temperature range sufficient to prevent unwanted condensation as mentioned in the discussion above. In one example, the faceplate 130 is made out of a corrosion resistant metal such as hard anodized aluminum.

The desired process temperature for the deposition of the silicon comprising film ranges from about 500° C. to 800° C. In an exemplary embodiment, the reaction chamber 108 maintains a process temperature sufficient to heat the substrate 132 to a temperature ranging from 500° C. to 800° C. In another embodiment, the temperature at the susceptor 122 is between 500° C. to 800° C. and is, preferably, at 700° C. It is to be appreciated that in the reaction chamber 108, the temperature of the substrate 132 may be about 20–30° cooler than the measured temperature of the susceptor 122. In one exemplary embodiment, the process temperature is based on the temperature measured from the susceptor 122.

The desired pressure for the deposition process is indicated by total pressure in the reaction chamber 108. In one exemplary embodiment, the desired pressure ranges from 10 Torr to 350 Torr and is, preferably, at 200 Torr throughout the deposition process.

The high process pressure and the process temperature are desirable to prevent unwanted particle condensation. For example, in the case of forming a silicon nitride ($Si_3N_4$) film using HCD and $NH_3$ as the precursors, a by-product called ammonium chloride salt ($NH_4Cl$) is generated. One exemplary current state of the art method uses the HCD and $NH_3$ in a conventional furnace system wherein the process pressure is well below 1.4 Torr. (See example, U.S. Pat. No. 6,333,547). Such low process pressure leads to the formation of the $NH_4Cl$, a salt particle) that requires an extensive clean-up effort to prevent contamination. On the contrary, the high process temperature and the high process pressure of the exemplary embodiments in this discussion prevents or at least minimizes the formation of the $NH_4Cl$ particles. The high pressure and temperature promote further promotes a formation of $SiCl_2$ (diclorosilylene) in gas phase which then undergoes an insertion reaction with $NH_3$ and form HCl, a gas by-product, which is easily eliminated (pumped out). Thus, because of the presence of $SiCl_2$, more HCl is formed instead of the $NH_4Cl$ particles.

In one exemplary embodiment, the reaction chamber 12 is stabilized using a stabilization gas such as $N_2$, He, Ar, or combinations thereof. In one example, a manifold is included in the gas panel system 201 which will release the stabilization gas into the reaction chamber 108. The stabilization gas can have a flow rate ranging from 1,000 sccm to 10,000 sccm, preferably, about 2,000 sccm for a reactor 100 having a capacity of 5–6 liters.

In one exemplary embodiment, the processor controller 900 including system control software (not shown) that can to control and adjust the processing temperature and pressure in the reaction chamber 108. In this embodiment, the processor controller 900 adjusts the temperature by raising the temperature of the heater assembly 104 to a temperature between 500° C.–800° C. The processor controller 900 may also adjust the processing pressure in the reaction chamber 108 as necessary.

The following sections describe in more details different processes for the formation of three different silicon comprising films, namely, $SiO_2$, $Si_3N_4$, and $Si_xN_yO_z$ on a substrate such as the substrate 132. It is to be appreciated that these films are only examples of the different types of silicon comprising films that can be formed. Other silicon comprising films can be formed using the exemplary embodiments without departing from the scope of the present invention. The processes described below can be carried out in a single-wafer deposition chamber such as the reactor 100 described above in reference to FIGS. 2 to 5. The $SiO_2$, $Si_3N_4$, and $Si_xN_yO_z$ films can be formed sequentially in the reactor 100. A particular process gas (or gases) for the particular film can be turned on while the other gas not needed, turned off, to form a particular film. For instance, the $SiO_2$ film is first formed on the substrate 132 with an HCD and an oxidation source gas turned on. Following the formation of the $SiO_2$ film, the $Si_xN_yO_z$ film is formed on the $SiO_2$ film when the substrate 132 is in the reactor 100 with a nitridation turned on. Following the formation of the $Si_xN_yO_z$ film, the $Si_3N_4$ film is formed on the $Si_xN_yO_z$ film, also when the substrate 132 is in the reactor 100 with the oxidation source gas turned off. An advantage of forming all of the films in the same reactor 100 sequentially is that there is no need to adjust the process temperature between each film formation. All of the films may be formed under the same process temperature (e.g., 500–800° C.). Moreover, all of the films can also be formed under the same process pressure (e.g., 10–350 Torr). Not needing to adjust the temperature is especially useful for a reactor where changing temperature is time consuming and difficult, for example, a resistively heated deposition chamber such as the reactor 100. Additionally, forming all of the films in the same reactor allows for rapid film formations and faster throughput since no adjustment to the process parameters is necessary and only the process gas (or gases) needs to be turned on or off.

Figure 6:
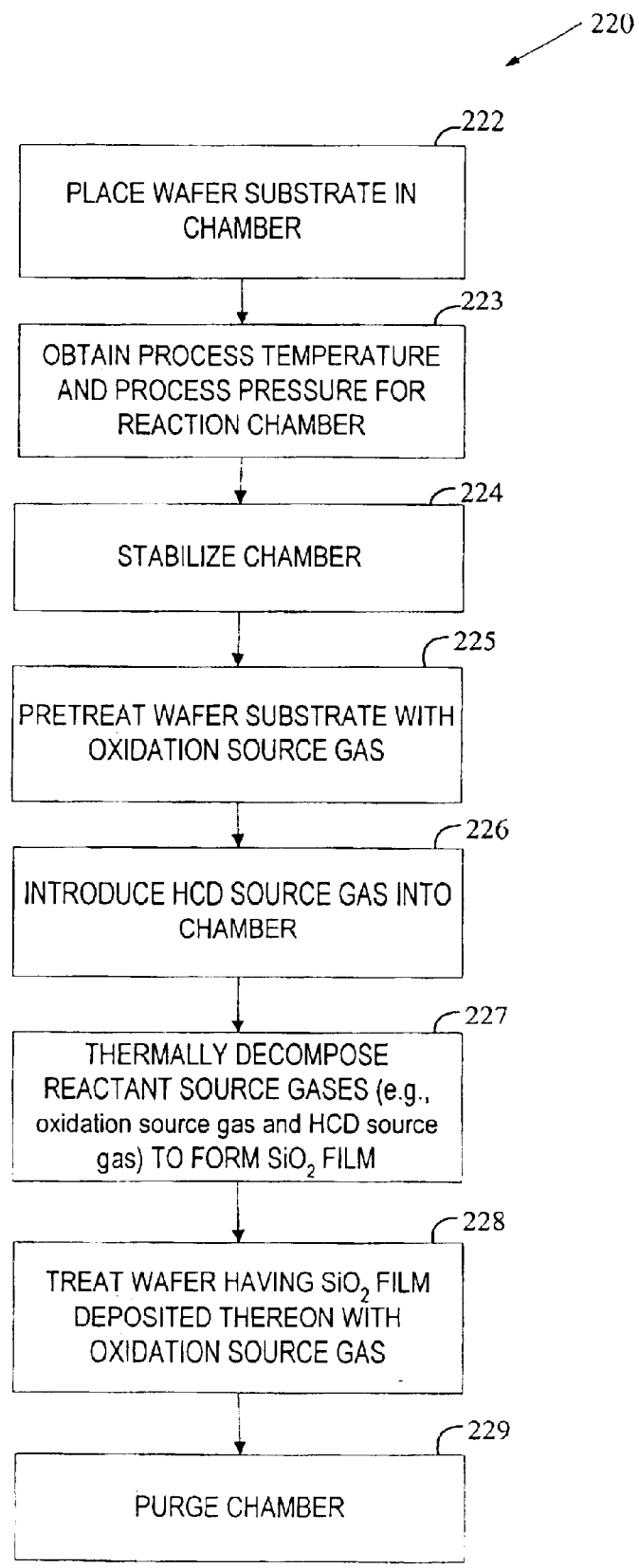
FIG. 6 illustrates an exemplary method of forming a silicon oxide film.

FIG. 6 illustrates a method 220 for forming a $SiO_2$ film. At operation 222, substrate is placed in the reaction chamber 108. In one embodiment, the substrate 132 is a silicon wafer. At operation 223, the process temperature and the process pressure are obtained. In one embodiment, 10 seconds is allotted to obtaining the process temperature and pressure. The process temperature is between 500–800° C. The process pressure is between 10 and 350 Torr. At operation 224, the reaction chamber 108 is stabilized. In one embodiment, a carrier such as nitrogen ($N_2$), hydrogen ($H_2$), helium (He), argon (Ar), and xenon (Xe), is introduced into the chamber 12 during stabilization. In one embodiment, the carrier gas has a flow rate between 1000 and 10,000, ideally, at 2000 sccm. In an exemplary embodiment, as illustrated at operation 225, the substrate is pre-treated with the oxidation source gas 153 (e.g., nitrous oxide, and ozone). The oxidation source gas is introduced into the reaction chamber 108 for about 3–10 seconds. In one embodiment, the oxidation source gas 153 is introduced into the reaction chamber 108 from the manifold 201(c) illustrated in FIG. 3. The oxidation source gas 153 can also be mixed with a carrier gas such as nitrogen prior to being introduced into the reaction chamber 108. In one example, the oxidation source gas 153 is introduced into the reaction chamber 108 at a flow rate of 500–1500 sccm. In another embodiment, the oxidation source gas 153 is introduced into the reaction chamber body 108 at a flow rate of about 1000 sccm. The flow rate for the oxidation source gas 153 can be varied depending on the desired growth rate and the composition of the $SiO_2$ film to be formed.

Continuing with FIG. 6, at operation 226, the HCD source gas 154 is introduced into the reaction chamber 108 through the manifold 201(b). In an exemplary embodiment, the HCD source gas 154 is already mixed with a carrier/dilution gas such as nitrogen. As can be seen from FIG. 3, the HCD source gas 154 and the dilution/carrier gas can be mixed in the manifold 201(b) to form the HCD gas mixture. In one exemplary, the gas mixture (the HCD source gas and the dilution gas) may have a flow ratio ranging from 1:5 to 1:200, preferably, 1:20 to 1:200, HCD source gas to dilution gas, respectively. In another example, the dilution/carrier gas has a flow rate ranging from about 1000 sccm to about 10,000 sccm with a preferred flow rate of about 2000 sccm. The HCD source gas has a flow rate ranging from about 50 sccm to about 200 sccm, preferably about 100 sccm.

In one exemplary embodiment, the HCD source gas 154 and the oxidation source gas 153 each enters the reaction chamber space 108 through a separate distribution point. In one example, the HCD source gas 154 enters through the distribution point 124 and the oxidation source gas 153 enters through the distribution point 123 as shown in FIG. 3. In this embodiment, the HCD source gas 154 and the oxidation source gas 153 are independently introduced into the reaction chamber 108 as previously described. The HCD source gas 154 and the oxidation source gas 153 are not allowed to mix until they leave the faceplate 130. In one exemplary embodiment, the flow ratio for the HCD source gas 154 and the oxidation source gas 153 have a flow ratio ranging from 1:1 to 1:1000, ideally from, 1:1 to 1:500.

In another embodiment, the HCD source gas 154, and the oxidation source gas 153 can be allowed to mix in the chamber lid 126 at the port 124 as previously mentioned. The gas mixture is then flown through the blocker plate 128 and the faceplate 130 before entering the reaction chamber 108. In one embodiment, the gas mixture is distributed to the first layer 130A of the faceplate 130. The first set of holes 195 in the first layer 130A then distributes the gas mixture into the reaction chamber 108. In some cases this pre-mixing can be beneficial to film uniformity.

Continuing with FIG. 6, at operation 227, the reactant source gases, the HCD source gas 154 and the oxidation source gas 153 are thermally decomposed to form the $SiO_2$ film on the substrate. In one exemplary embodiment, the substrate has a temperature of 700° C., which is sufficient to thermally decompose the oxidation source gas 153 and the HCD source gas 154. Upon decomposition, the silicon and the oxygen containing intermediate species from the decomposed gases react and form the $SiO_2$ film on the surface of the heated substrate. Depending on the desired thickness of the $SiO_2$ film, the processing temperature and pressure, the growth rate, as well as the flow rates of all of the reactant gases, the deposition process may take from 30 seconds to 90 seconds. For example, to from a $SiO_2$ film with a growth rate of about 30 Å/min to 2000 Å/min and a thickness of about 10 Å to 3000 Å in the reaction chamber 108 at a temperature from 500° C. to 800° C. and a pressure from 10 Torr to 350 Torr, the deposition time can be from 30 seconds to 90 seconds.

In one exemplary embodiment no external source of excitation such as plasma, photon, or radiation is necessary to facilitate the speed of the decomposition of the reactant gases.

Still with FIG. 6, in one exemplary embodiment, when the deposition of the SiO$_2$ film is complete, the substrate 132 is treated with the oxidation source gas as set forth at operation 228. In this embodiment, only the oxidation source gas is introduced into the reaction chamber 108 for about 10 seconds. Treating the SiO$_2$ film with the oxidation source gas at the end of the deposition step terminates unreacted silicon site upon the substrate 132. This operation maximizes uniformity, and reduces surfaces roughness. However, the operation 228 is not necessary to achieve a good SiO$_2$ film.

When the deposition is complete, the reaction chamber 108 may be purged as set forth in operation 229. Purging is accomplished by introducing, for example, a carrier gas, such as nitrogen into the reaction chamber 108 for a predetermined amount of time. Purging may be done by releasing nitrogen from the manifold 201(c) into the reaction chamber 108. Purging may also be accomplished by cleaning the reaction chamber 108 with a cleaning gas. The cleaning gas can also be released from a manifold that may be included into the gas panel system 201 shown in FIG. 3.

Upon the completion of the deposition, the wafer substrate 132 having the SiO$_2$ film deposited thereon is separated from the surface of the susceptor 122 according to the mechanism described previously.

Figure 7:
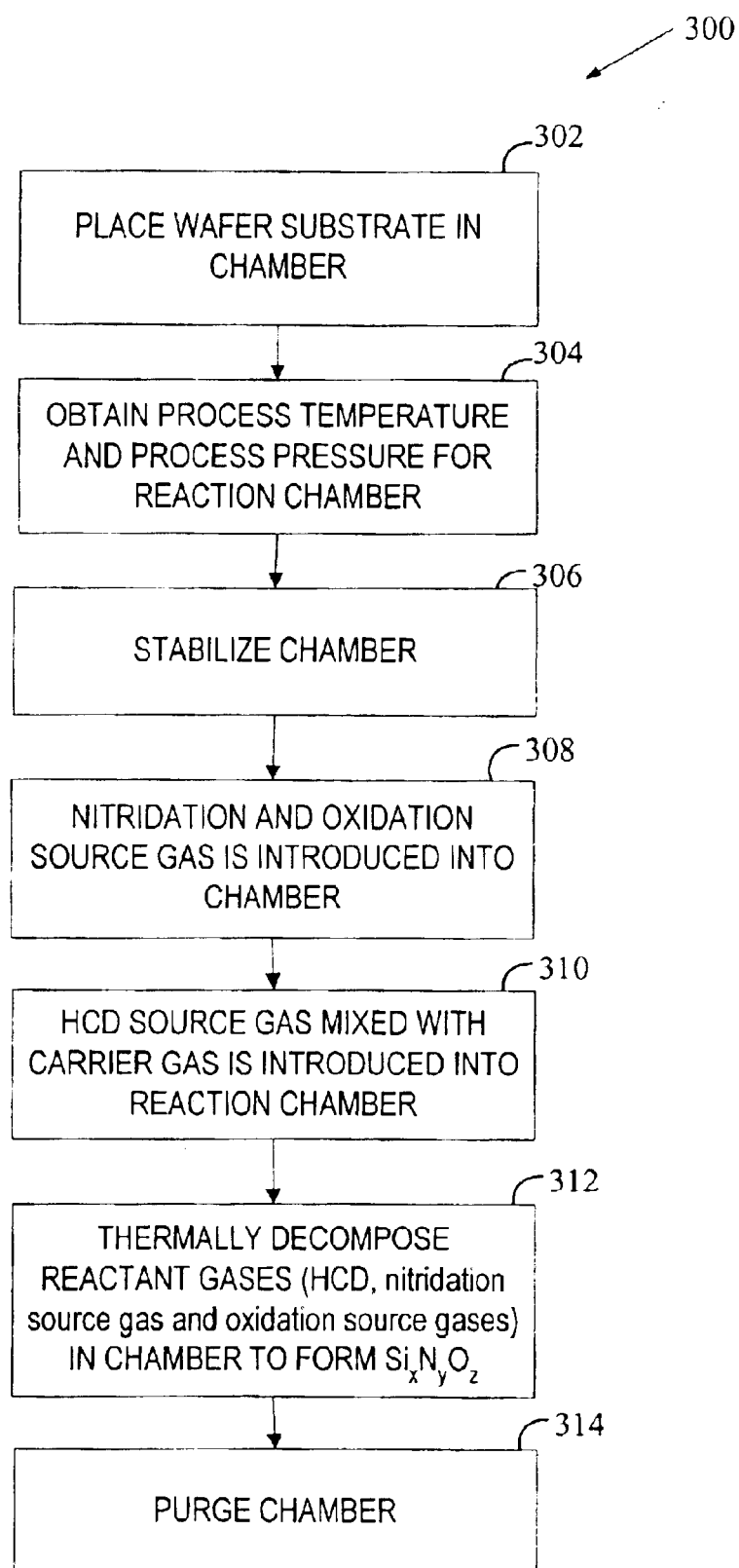
FIG. 7 illustrates an exemplary method of forming a silicon oxynitride film.

FIG. 7 illustrates a method 301 for forming a silicon-oxynitride (Si$_x$N$_y$O$_z$) film. The method 301 is similar to the method 220 described above except that in this method, a nitridation source gas is introduced into the reaction chamber 108. At operation 302, a substrate is placed in the reaction chamber 108 also as discussed above. At operation 304, the process temperature (500° C. to 800° C.) and the process pressure (10 Torr to 350 Torr) are obtained for the reaction chamber as discussed above. At operation 306, the reaction chamber 108 is stabilized.

At operation 308, a nitridation source gas 155 is introduced into the reaction chamber 108, for example, through the manifold 201(a) described in FIG. 3. The nitridation source gas 155 may be ammonia (NH$_3$) or hydrazine (N$_2$H$_4$). Also at operation 308, the oxidation source gas 153 is introduced into the reaction chamber 108. At operation 310, the HCD source gas 154 is introduced into the reaction chamber 108 similar to the operation 226 in FIG. 6. The flow rates for the HCD source gas 154 and the oxidation source gas 153 are similar to the method 220 described above (e.g., 50–200 sccm for the HCD source gas 154 and 500–1500 sccm for the oxidation source gas 153). The flow rate for the nitridation source gas 155 can be between 500 sccm to 1500 sccm, ideally, 1000 sccm.

Similar to the method 220, in the method 301, the HCD source gas 154, the nitridation source gas 155, and the oxidation source gas 153, each enters the reaction chamber 108 through a separate distribution points. The HCD source gas 154 enters through the distribution point 124, the nitridation source gas 155 enters through the distribution point 125, and the oxidation source gas 153 enters through the distribution point 123 as shown in FIG. 3.

In another example, the HCD source gas 154, the nitridation gas 155, and the oxidation source gas 153 can be allowed to mix in the chamber lid 126 at the port 124 as previously mentioned. The gas mixture is then flown through the blocker plate 128 and the faceplate 130 before entering the reaction chamber 108. In one embodiment, the gas mixture is distributed to the first layer 130A of the faceplate 130. The first set of holes 195 in the first layer 130A then distributes the gas mixture into the reaction chamber 108.

In one exemplary embodiment, the HCD source gas 154, the nitridation source gas 155, and the oxidation source gas 153 have a flow ration between 1:1:1 to 1:1000:1000, ideally, between 1:1:1 to 1:500:500. Each of the flow rates of the HCD source gas 154, the nitridation source gas 155, and the oxidation source gas 153 can be independently adjusted to create a flow ratio that falls within the flow ratios listed. The flow ratio for the HCD source gas, the oxidation source gas, and the nitridation source gas determines the composition of the silicon-oxynitride film.

Continuing with FIG. 7, at operation 312, the HDC source gas 154, the oxidation source gas 153, and the nitridation source gas 155 are thermally decomposed to form a Si$_x$N$_y$O$_z$ film on the substrate. In one exemplary embodiment, the substrate has a temperature of 700° C., which is sufficient to thermally decompose the oxidation source gas 153, the nitridation source gas 155, and the HCD source gas 154. Upon decomposition, the silicon, the nitrogen, and the oxygen containing intermediate species from the decomposed gases react and form the silicon-oxynitride film on the surface of the heated substrate.

All parameters of the method 301 can be varied similar to the parameters (e.g., the film thickness, the film growth rate, and the deposition time) for the method 220.

In one exemplary embodiment, no external source of excitation such as plasma, photon, or radiation is used to facilitate the speed of the decomposition of the reactant gases.

When the deposition is complete, the reaction chamber 108 may be purged as set forth in operation 314. Purging is accomplished by using the operation as in the method 220 above. Upon the completion of the deposition, the substrate having the Si$_x$N$_y$O$_z$ film deposited thereon is separated from the surface of the susceptor 122 according to the mechanism described previously.

Figure 8:
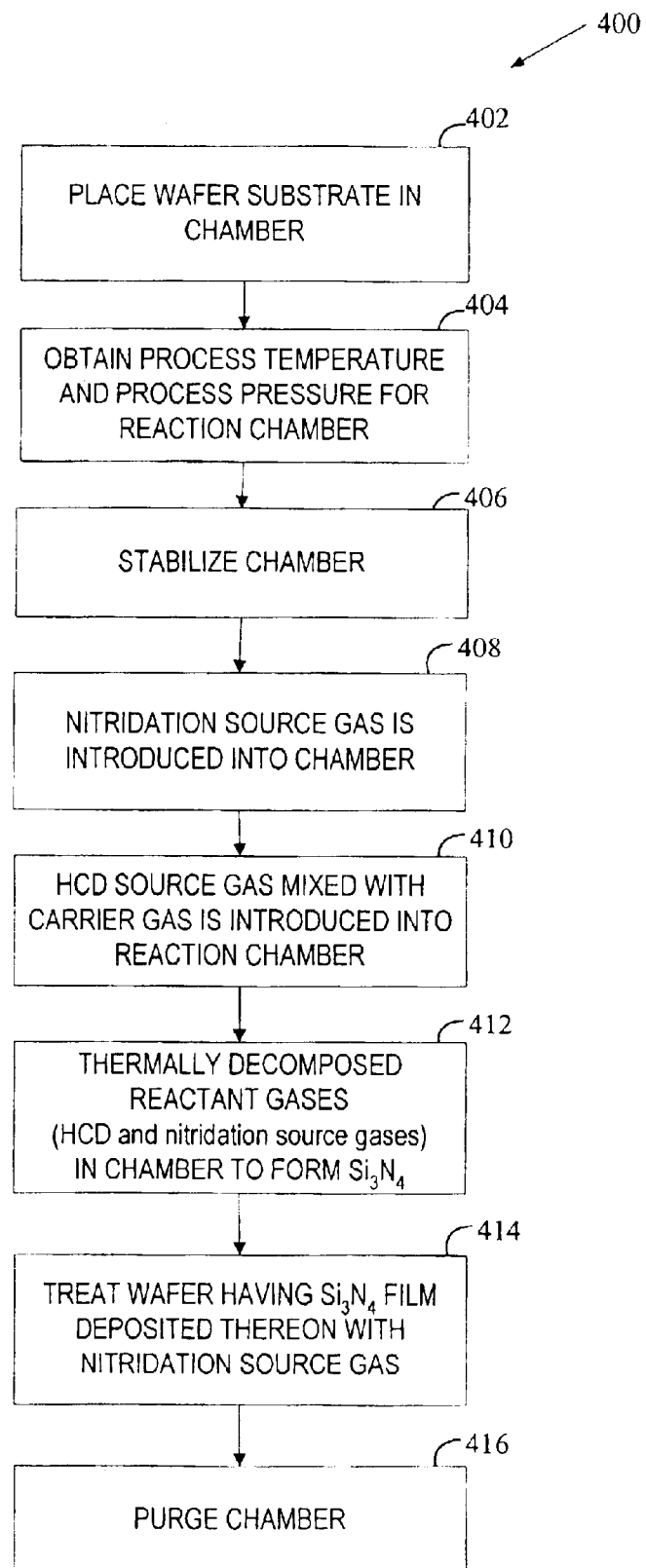
FIG. 8 illustrates an exemplary method of forming a silicon nitride film.

FIG. 8 illustrates an exemplary method 400 for forming a silicon nitride (Si$_3$N$_4$) film. The method 400 is similar to the method 301 described above except that in the method 400, the oxidation source gas is cut off or that no oxidation source gas is introduced into the reaction chamber 108. At operation 402, a substrate is placed in the reaction chamber 108. At operation 402, the process temperature (500–800° C.) and the process pressure (10–350 Torr) are obtained. At operation 406, the reaction chamber 108 is stabilized.

At operation 408, a nitridation source gas 155 is introduced into the reaction chamber 108. The nitridation source gas may be ammonia (NH$_3$) or hydrazine (N$_2$H$_4$). At operation 410, the HCD source gas 154 is introduced into the reaction chamber 108. In one exemplary embodiment, similar to the methods 300, the HCD source gas 154 is already mixed with a carrier gas such as nitrogen prior to being introduced into the reaction chamber 108. In one example, the flow rates for the HCD source gas 154 and the nitridation source gas 154 are similar to what are used in the method 301 (e.g., 50–200 sccm for the HCD source gas 154 and 500–1500 sccm for the nitridation source gas 155). In another example, the HCD source gas 154 and the nitridation source gas 155 have a flow rate 1:1 and 1:1000, ideally, between 1:1 and 1:500.

Similar to the method 301, in the method 400, the HCD source gas 154 and the nitridation source gas 155, each enters the reaction chamber 108 through a separate distribution points, e.g., the HCD source gas 154 enters through the distribution point 124, and the nitridation source gas 155 enters through the distribution point 125 as shown in FIG. 3.

In another example, the HCD source gas 154 and the nitridation source gas 155 can be allowed to mix in the chamber lid 126 at the port 124 as previously mentioned. The gas mixture is then flown through the blocker plate 128 and the faceplate 130 before entering the reaction chamber 108. In one embodiment, the gas mixture is distributed to the first layer 130A of the faceplate 130. The first set of holes 195 in the first layer 130A then distributes the gas mixture into the reaction chamber 108.

At operation 412 of the method 400, the nitridation source gas 155 and the HCD source gas 154 are thermally decomposed. Upon decomposition, the silicon and the nitrogen containing intermediate species from the decomposed gases react and form the silicon nitride film ($Si_3N_4$) on the surface of the substrate.

Equivalent to method 220, when the deposition of $Si_3N_4$ is complete, the substrate is treated with the nitridation source gas, as set forth at operation 414. Only the nitridation source gas is introduced into the reaction chamber 108 for about 10 seconds. Treating the $Si_3N_4$ film with the nitridation source gas at the end of the deposition step terminates unreacted silicon sites upon the substrate. This operation reduces hydrogen (specifically in the Si—H bonded form) in the $Si_3N_4$ film. However, operation 414 is not necessary to achieve a good $Si_3N_4$ film.

All parameters of the method 400 can be varied similar to the parameters (e.g., the film thickness, the film growth rate, and the deposition time) for the method 301.

In one exemplary embodiment, no external source of excitation such as plasma, photon, or radiation is used to facilitate the speed of the decomposition of the reactant gases.

When the deposition is complete, the reaction chamber 108 may be purged as set forth in operation 416. Upon the completion of the deposition, the substrate having the $Si_3N_4$ film deposited thereon is separated from the surface of the susceptor 122 according to the mechanism described previously.

All of the exemplary methods above may further include an annealing step. The annealing operation is not necessary for all of the silicon comprising films. Annealing however may improve the resulting silicon comprising films such as giving the films superior etch properties. Annealing the substrates with the silicon comprising films formed according to the exemplary embodiments can be accomplished by a conventional rapid thermal annealing process. The substrates may be annealed for 15 to 120 seconds with an annealing temperature ranging from 800° C. to 1200° C. In some examples, the annealing is carried out without exposing the substrates having the silicon comprising films to air by annealing the substrate in an annealing chamber that is part of a cluster tool (see below) that includes the deposition chambers that are used to form the silicon comprising films.

Varying the process parameters, such as the flow ratio of the reactant gases such as varying the flow ratio of the HCD source gas 154 and the oxidation source gas 153 or the flow ratio of the HCD source gas 154 and the nitridation source gas 155, enables the forming of the silicon comprising films with adjustable etch rates and refractive index. The silicon comprising films formed with the exemplary methods described above can have adjustable and controllable step coverages (e.g., physical coverage) and conformalities (e.g., electrical and physical uniformity) over the particular structures on the wafer substrate 132.

The silicon comprising films formed according to the exemplary methods discussed above have growth rates ranging from 45 Å/minute to 2000 Å/minute. In some embodiments, the silicon comprising films have thicknesses ranging from 10 Å to 3000 Å. In yet some other embodiments, the substrates with the silicon comprising films formed thereon are annealed using a rapid thermal annealing process which gives the silicon comprising films superior etch properties. The films also have film qualities, such as etch rate and thickness that are tunable through a wide variation in growth rate and process flexibility. The films formed in the exemplary embodiments above are further substantially uniform. For example, the film has a non-uniformity below 1.2% (49 points, 3 mmEE, 1 σ). The film also has a controllable growth rate ranging from 30 Å/min to 2000 Å/min, tunable refractive index in the range of 1.85 to 2.20, and extremely low particle adders.

Figure 9:
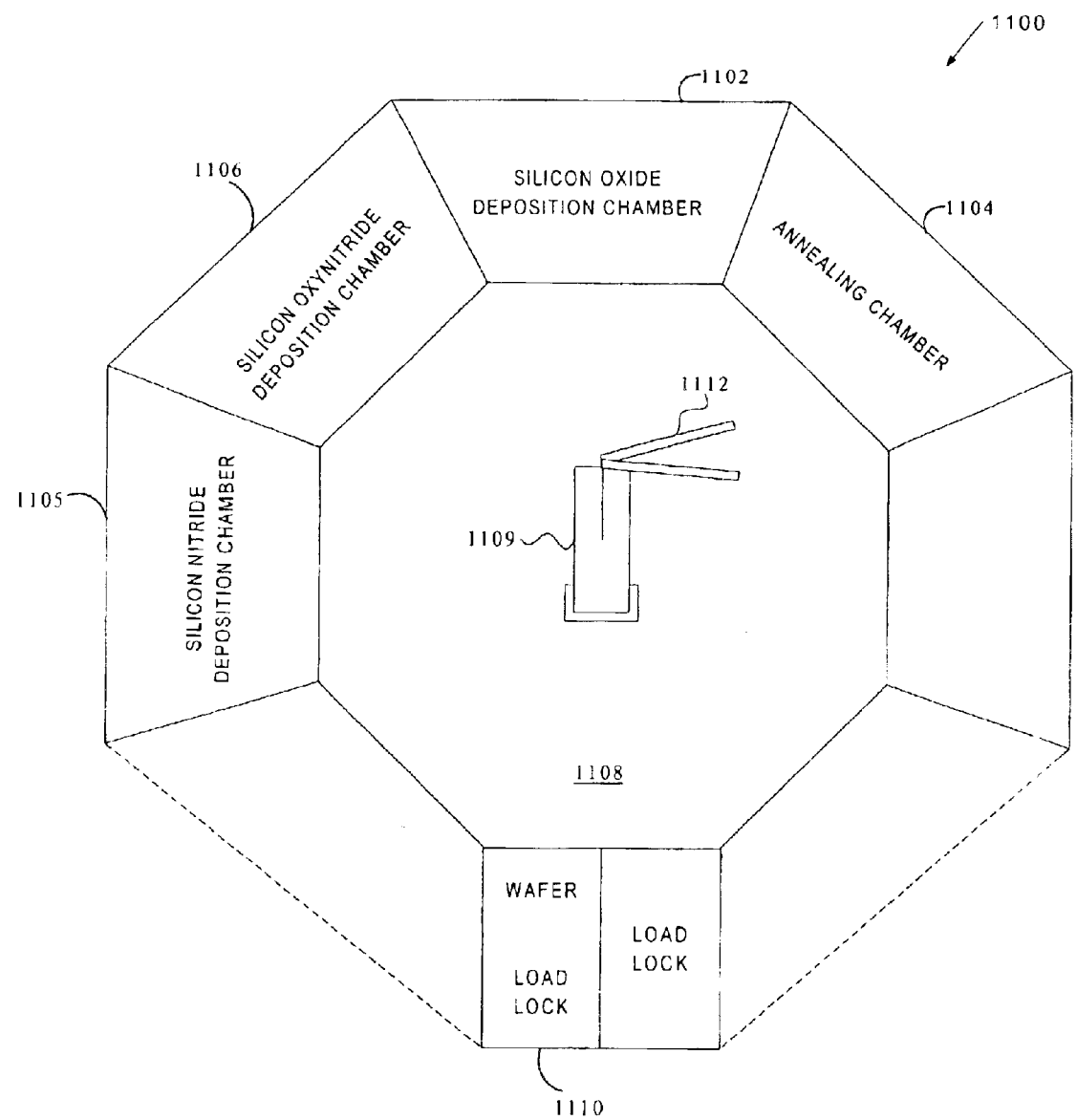
FIG. 9 shows an exemplary cluster system that include multiple chambers that can be used to practice the exemplary embodiments.

The various silicon comprising films can be formed in one chamber ("in situ") or in different chambers that are arranged into a cluster tool. FIG. 9 illustrates an exemplary cluster tool 1100 that includes several processing chambers. For example, the cluster tool 1100 includes a silicon oxide deposition chamber 1102, an annealing chamber 1104, a silicon nitride deposition chamber 1105, and a silicon oxynitride deposition chamber 1106. Each of the silicon oxide deposition chamber 1102, the silicon nitride deposition chamber 1105, and the silicon oxynitride deposition chamber 1106 can be a reaction chamber like the reactor 100 described above.

The cluster tool 1100 also includes a transfer chamber 1108 having a wafer handler 1109 (e.g., a robot), which includes a wafer clip 1112 for handling a wafer (or a substrate) that is to be deposited into one of the chambers mentioned above. The wafer clip 1112 can be the transfer blade 166 described above in FIG. 5. The transfer chamber 1108 is further coupled to a load lock system 1110, which stores the wafer substrates to be processed. In one example, the wafer handler 1109 removes a substrate (e.g., a wafer) from the load lock system 1110 and places the substrate into an appropriate chamber depending on a process protocol. The wafer handler 1109 also removes the substrate from the chamber once the processing is complete and moves the substrate to the next processing chamber or into the load lock system 1110.

The transfer chamber 1108 is typically set at a reduced pressure as compared to the atmospheric condition. The transfer chamber 1108 can also be set at a pressure close to the process pressure that the chambers will be operating at. The cluster tool 1100 is also set at a pressure that once the wafers are in the load lock system 1110, the loading of other substrates into other chambers does not impact the operating conditions inside each chamber. When multiple processes are involved, for example, depositing the silicon oxide layer, depositing the silicon nitride layer, depositing the silicon oxide layer, and then annealing the substrate, the wafer handler 1109 is used to move the substrate from one chamber to the next chamber for each process. For example, to deposit the silicon oxide film and anneal the substrate after the deposition, the wafer handler 1109 removes the substrate from the load lock system 1110, places the substrate in the chamber 1102 for the deposition of the silicon oxide film. The wafer handler 1109 then removes the substrate from the chamber 1102 upon the completion of the silicon oxide film deposition and places the substrate into the annealing chamber 1104 for annealing.

The exemplary methods described above are particularly useful for fabricating devices having multiple silicon comprising films. Such device include but are not limited to an ONO (silicon oxide/silicon nitride/silicon oxide) stack typically used for a flash memory gate in a transistor, an ONO spacer, a liner oxide trench, an antireflective coating on a hard mask, a dielectric layer in a capacitor, and side wall spacers in a MOS transistor, to name a few.

All of the multiple silicon comprising films can be formed using the cluster tool 1100 described above or can be formed "in situ" or in the same chamber (i.e., the reaction chamber 108). With either approach, in situ or using the cluster tool 1100, the silicon comprising films are not exposed to an oxidizing ambient or to contaminants before the deposition of one film upon another film thereby enabling a clean interface to be achieved between the films.

Figure 10A:
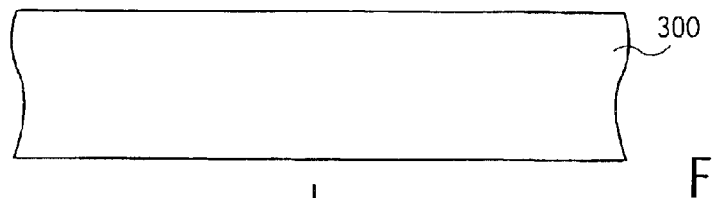
FIGS. 10A, 10B, 10C, 10D, 10E and 10F show an ONO spacer made according to some of the exemplary methods described in the present invention.
Figure 10B:
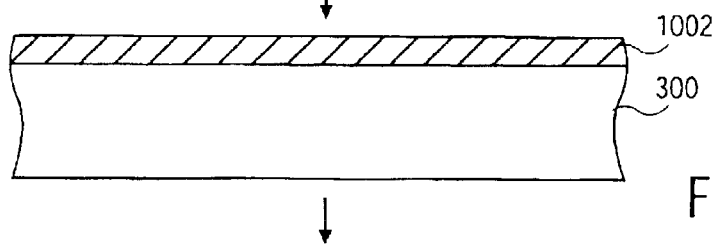

In one exemplary embodiment, the exemplary methods described above can be used to form a spacer of an electronic device as illustrated in FIGS. 10A to 10F. A substrate 300 is provided as shown in FIG. 10A. A gate dielectric layer 1002 formed on the substrate 300 as shown in FIG. 10B. The substrate 300 can be a single crystalline silicon, a monocrystalline semiconductor wafer, or any other substrate used to form semiconductor devices. In these types of devices, the substrate 300 will typically include isolation regions (not shown) such shallow trench isolation (STI) regions to isolate the individual device to be formed on/in the substrate 300. The STI regions can be formed using the exemplary methods discussed above. In one example, where the electronic device is a transistor, the substrate 300 can be doped with impurities appropriate for either a p-type transistor or an n-type transistor. The gate dielectric 1002 can be made out of any suitable insulating material for semiconductor devices such as silicon dioxide, silicon oxynitride, or nitrided oxides. In one embodiment the gate dielectric 1002 is formed by thermal oxidation using conventional methods.

Figure 10C:
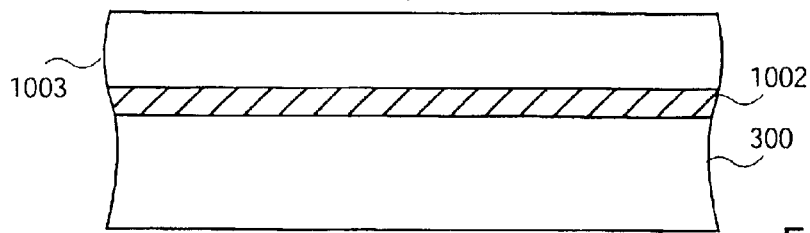
Figure 10D:
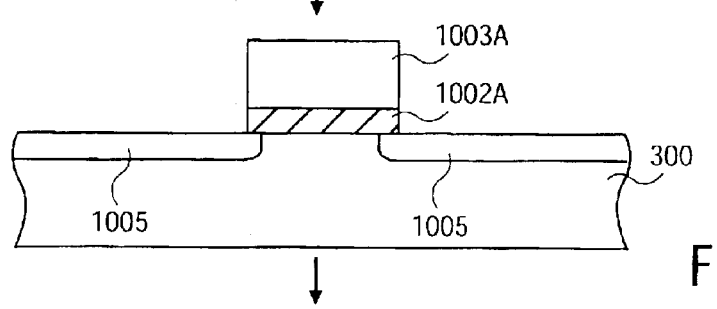

Next, as shown in FIG. 10C, a gate electrode film 1003 such as polysilicon is blanketly deposited over gate dielectric 1002. Next, as shown in FIG. 10D, well known photolithography and etching techniques are used to pattern the films into a gate electrodes 1003A and gate dielectric 1002. If desired, at this time, well known doping techniques such as ion implantation can be used to form source/drain regions 1005.

Figure 10E:
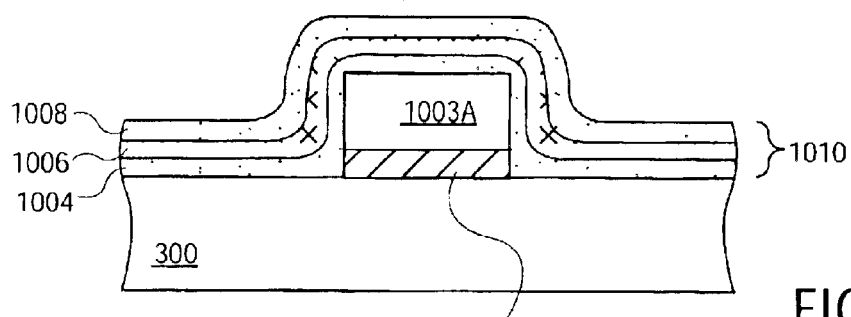
Figure 10F:
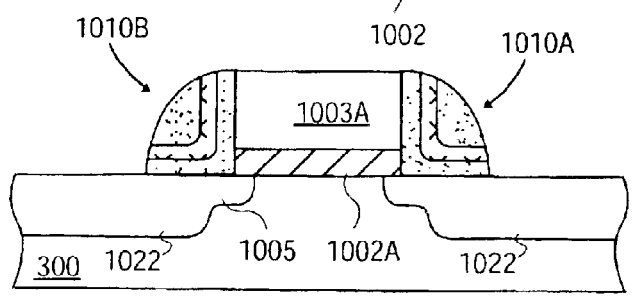

FIG. 10D shows how the methods discussed above are applied to form a spacer for the electronic device. In one embodiment, a silicon oxide layer 1004 is deposited (via blanket deposition) according to the methods (e.g., method 400, FIG. 8) discussed above. Next, a 1006 silicon nitride film is also deposited according to the methods (e.g., method 220) discussed above. And, silicon oxide layer 1008 is deposited according to the methods discussed above. Each of the layers can be formed in separate chambers using cluster tool 1100 mentioned above or formed in situ in one chamber. The combination of the layers 1004, 1006, and 1008 constitutes an ONO stack 1010 as illustrated in FIG. 10E. Each of the layers in the ONO stack 1010 formed according to the exemplary embodiments of the present invention may have different thickness depending on application. The thickness for each of the layers can be controlled by varying the time of deposition depending on the temperature, pressure, and concentration and/or ratio of the reactant gases. Next, the ONO stack 1010 can then be anisotropically etched using conventional methods to create spacers 1010A and 1010B as shown in FIG. 10F. Spacers 1010A and 1010B can then be used to space away an implant to form high doping and/or deep source/drain regions 1022.

Figure 10G:
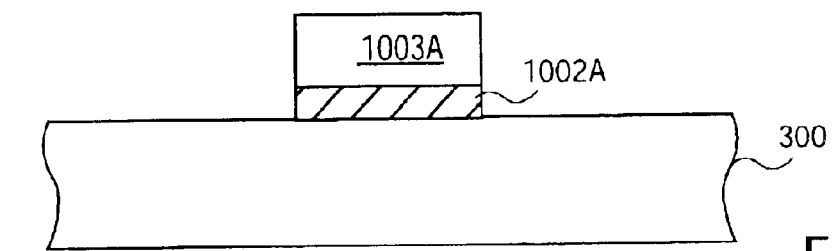
FIGS. 10G, 10H, and 10I show an exemplary FLASH memory device made according to some of the exemplary methods described in the present invention.
Figure 10H:
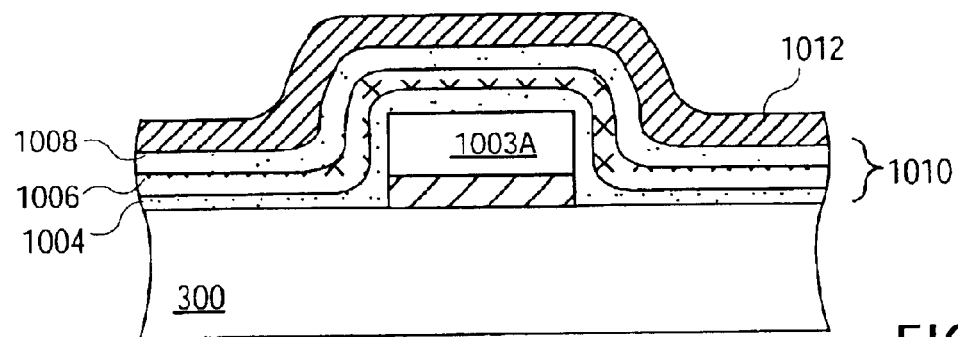
Figure 10I:
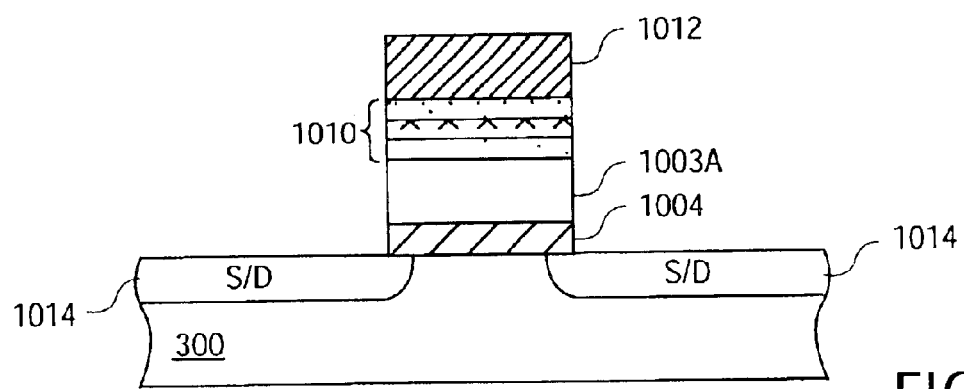

FIG. 10G shows an exemplary FLASH memory made in accordance to some exemplary methods of the present invention. In this figure, the substrate 300 includes a gate dielectric layer 1002A and a gate electrode 1003A which is sometimes referred to as a floating gate electrode. The gate dielectric layer 1002A and the gate electrode 1003A are formed using the same methods used for the previous two examples (FIGS. 10A to 10F discussion). The ONO stack 1010 is then blanketly deposited as discussed above. Additionally, a control gate electrode 1012 is deposited over the ONO stack as shown in FIG. 10H using for example, a chemical vapor deposition process. And, finally, masking, etching, and doping methods are used to form the FLASH memory device as shown in FIG. 10I.

In one exemplary embodiment, the methods described above can be applied to form a stack that is graded such that the stack is graded from comprising silicon oxide to silicon oxynitride and to silicon nitride. The composition of the graded stack can be varied by varying the precursor/reactant gases that are introduced into the deposition chamber. In one example, the stack is graded in composition from silicon oxide to silicon nitride with silicone oxynitride in between. In another example, the stack is graded so that no silicon oxynitride is present. As illustrated, the stack can be formed with different composition to make up several layers of different types of silicon comprising films that typically requires separate processing steps using conventional methods. Forming the stack by such grading is preferably carried out in an insitu deposition process wherein the reactant gases is introduced or cut off to form the different composition for different layers.

Referencing back to the reactor 100 as shown in FIGS. 2–5, and as shown in FIG. 3, the reactor 100 includes a processor/controller 900 and a memory 902, such as a hard disk drive. The processor/controller 900 may include a single board (SBC) analog and digital input/output boards, interface boards and stepper motor controller board. The processor/controller 900 controls all activity of the reactor 100. The system controller executes system control software, which is a computer program stored in a computer readable medium such as the memory 902. The memory 902 can be stored in a hard disk, a floppy disk, a compact disc ROM (CD-ROM), a digital video disc (DVD-ROM), a magnetic optical disk, or any other types of media suitable for storing electronic instructions. The computer program includes sets of instructions that dictate the timing, mixture of gases, chamber pressure, heater temperature, power supply, heater assembly position, and other parameters of the silicon comprising film or multi-film deposition processes of the present invention. The computer program code can be written in any conventional computer readable programming language such as 68000 assembly language, C, C++, Pascal, Fortran, or others. Subroutines for carrying out process gas mixing, pressure control, and heater control are stored within the memory 902. Also stored in the memory 902 are process parameters such as process gas flow rates and compositions, temperatures, and pressures necessary to form the silicon comprising films discussed above.

Thus, according to an exemplary embodiment of the present invention, instructions for process parameters for forming the silicon comprising films are stored in the memory 902. In another exemplary embodiment, the instructions provide for when and how much of the reactant gases (e.g., the HCD source gas, the oxidation source gas, and the nitridation source gas) are to be introduced into the reaction chamber 108. In another embodiment, the instructions provide that the HCD source gas or the oxidation source gas is premixed with the dilution/carrier gas prior to being introduced into the reaction chamber 108. The instructions also provide for the flow ratios of the reactant gases and/or the flow ratio of the reactant gases to the dilution/carrier gas. For example, the instructions may provide that the HCD source gas is released into the reaction chamber 108 with the carrier gas/dilution gas wherein the amount of the carrier gas is substantially greater than the amount of the HCD source gas. Further yet, the instructions also provide how much, how hot, and when to heat the reaction chamber 108 or the susceptor 122 in the reaction chamber 108. For example, the instructions may provide for heating the susceptor 122 to a temperature 500–800° C. The instructions also provide for the controlling of the pressure of the reaction chamber 108. For example, the instructions may provide for the pressure to be between 10–350 Torr. The instructions also provide for independent control and variation of the flow rates of each of the reactant gases and the dilution/carrier gas that are introduced into the reaction chamber 108.

In another exemplary embodiment, the cluster tool 1100 of FIG. 9 also includes a processor/controller 900 and a memory 902 (not shown in FIG. 9) similar to that included in the reactor 100 described above. In addition to the functions of the instructions as described for the reactor 100, the instructions here further provide for the operation of moving the substrate(s) in and out of any particular chamber in the cluster tool 1100 for processing and other operation pertaining to operating the cluster tool 1100.

The instructions thus provide or control for most if not all of the operations of the deposition processes for the films in the reactor 100 or in the cluster tool 1100.

Thus, silicon comprising films and their methods of fabrication have been described wherein a HCD source gas is used to form the films and wherein the deposition occurs in a single-wafer deposition chamber at a process temperature ranging from about 500–800° C. and a process pressure ranging from 10–350 Torr.

We claim:

1. A method of forming a silicon comprising film comprising:
    placing a substrate in a deposition chamber; and
    forming said silicon comprising film above said substrate wherein one of reactant species for forming said film includes a hexachlorodisilane (HCD) source gas and wherein a process pressure for said deposition chamber is maintained in the range of 10 to 350 Torr during deposition process;
    mixing said HCD source gas with a nitridation source gas to form said silicon comprising film wherein said comprising film includes silicon nitride; and
    treating said silicon comprising film that includes silicon nitride with said nitridation source gas after said silicon comprising film is formed.

2. A method as in claim 1, further comprises mixing said HCD source gas with an oxidation source gas to form said silicon comprising film that includes silicon-oxynitirde and treating said silicon comprising film that includes silicon-oxynitride with said nitridation source gas after said silicon comprising film is formed.

3. A method of forming a silicon comprising film comprising:
    placing a substrate in a deposition chamber; and
    forming said silicon comprising film above said substrate wherein one of reactant species for forming said film includes a hexachlorodisilane (HCD) source gas and wherein a process pressure for said deposition chamber is maintained in the range of 10 to 350 Torr during deposition process;
    mixing said HCD source gas with a nitridation source gas to form said silicon comprising film wherein said silicon comprising film includes silicon nitride;
    mixing said HCD source gas with an oxidation source gas to form said silicon comprising film wherein said silicon comprising film includes silicon-oxynitride; and
    maintaining an oxidation source gas flow rate to be equal to or less than a nitridation source gas flow rate.

4. A method of forming a silicon comprising film comprising:
    placing a substrate in a deposition chamber; and
    forming said silicon comprising film above said substrate wherein one of reactant species for forming said film includes a hexachlorodisilane (HCD) source gas and wherein a process pressure for said deposition chamber is maintained in the range 10 to 350 Torr during deposition process;
    mixing said HCD source gas with an oxidation source gas to form said silicon comprising film wherein said silicon comprising film includes silicon oxide; and
    treating said silicon comprising film that includes silicon oxide with said oxidation source gas after said silicon comprising film is formed.

5. A method of forming a silicon comprising film comprising:
    placing a substrate in a deposition chamber; and
    forming said silicon comprising film above said substrate wherein one of reactant species for forming said film includes a hexachlorodisilane (HCD) source gas and wherein a process pressure for said deposition chamber is maintained in the range of 10 to 35 Torr during deposition process;
    annealing substrate using a thermal annealing process.

6. A method of forming a silicon comprising film including:
    placing a substrate in a deposition chamber;
    obtaining a process temperature ranging from about 500° C. to about 800° C. and a process pressure ranging from about 10 to about 350 Torr;
    introducing a nitridation source gas into said deposition chamber;
    introducing a HCD source gas and a carrier gas into said deposition chamber; and
    decomposing said HCD source gas and said nitridation source using a thermal energy source to form said silicon comprising film above said substrate wherein said silicon comprising film is a silicon nitride film; and
    treating said silicon comprising film with said nitridation source gas after said silicon comprising film is formed.

7. A method of forming a silicon comprising film including:
    placing a substrate in a deposition chamber;
    obtaining a process temperature ranging from about 500° C. to about 800° C. and a process pressure ranging from about 10 to about 350 Torr;
    introducing a nitridation source gas into said deposition chamber;
    introducing a HCD source gas and a carrier gas into said deposition chamber; and
    decomposing said HCD source gas and nitridation source using a thermal energy source to form said silicon comprising film above said substrate wherein said silicon comprising film is a silicon nitride film; and wherein said HCD source gas and said carrier gas have a flow ratio between 1:20 and 1:100.

8. A method of forming a silicon comprising film including:

placing a substrate in a deposition chamber;

obtaining a process temperature ranging about 500° C. to about 800° C. and a process pressure ranging from about 10 to about 350 Torr;

introducing a nitridation source gas into said deposition chamber;

intriducing a HCD source gas and a carrier gas into said deposition chamber; and decomposing said HCD source gas and said nitridation source using a thermal energy source to form said silicon comprising film above said substrate wherein said silicon comprising film is a silicon nitride film; and wherein said HCD source gas and said nitridation source gas have a flow ratio between 1:1 and 1:500.

9. A method of forming a silicon comprising film including:

placing a substrate in a deposition chamber;

obtaining a process temperature ranging abougt 500° C. to about 800° C. and a process pressure ranging from about 10 to about 350 Torr;

introducing a nitridation source gas into said deposition chamber;

introducing an oxidation source into said deposition chamber;

intriducing a HCD source gas and a carrier gas into said deposition chamber; and decomposing said HCD source gas, said nitridation source gas, and said oxidation source gas using a thermal energy source to form said silicon comprising film above said substrate wherein said silicon comprising film is a silicon-oxynitride film; and wherein said HCD source gas, said nitridation source gas, and said oxidation source gas have a flow ratio between 1:1:1 to 1:1000:1000.

10. A method of forming a silicon comprising film including:

placing a substrate in a deposition chamber;

obtaining a process temperature from about 500° C. to about 800° C. and a process pressure ranging from about 10 to about 350 Torr;

introducing a nitridation source gas into said deposition chamber;

introducing an oxidation source into said deposition chamber;

introducing a HCD source gas and a carrier gas into said deposition chamber; and decomposing said HCD source gas, said nitridation source gas, and said oxidation source gas using a thermal energy source to form said silicon comprising film above said substrate wherein said silicon comprising film is a silicon-oxynitride film; and treating said silicon comprising film with said nitridation source gas after said silicon comprising film is formed.

11. A method of forming a silicon comprising film including:

placing a substrate in a deposition chamber;

obtaining a process temperature ranging from about 500° C. to about 800° C. and a process pressure ranging from about 10 to about 350 Torr;

introducing an oxidation source gas into said deposition chamber;

introducing a HCD source gas and a carrier gas into said deposition chamber; and decomposing said HCD source gas and said oxidation source gas in using a thermal energy source to form said silicon comprising film above said substrate wherein said silicon comprising film is a silicon oxide film; and treating said silicon comprising film with said oxidation source gas after said silicon comprising film is formed.

12. A method of forming a silicon comprising film including:

placing a substrate in a deposition chamber;

obtaining a process temperature ranging from about 500° C. to about 800° C. and a process pressure ranging from about 10 to about 350 Torr;

introducing an oxidation source gas into said deposition chamber;

introducing a HCD source gas and a carrier gas into said deposition chamber; and decomposing said HCD source gas and said oxidation source gas in using a thermal energy source to form said silicon comprising film above said substrate wherein said silicon comprising film is a silicon oxide film; and wherein said HCD source gas and said oxidation source gas have a flow ration between 1:1 and 1:500.

13. A process of forming a silicon comprising film comprising:

placing a substrate in a deposition chamber;

said deposition chamber further includes a water passage to create a cold-wall deposition chamber, a temperature-controlled liner inside said deposition chamber to prevent unwanted condensation of reactant species, and resistively heating assembly to heat up said substrate wherein said substrate is horizontally placed in said deposition chamber;

introducing a HCD source gas diluted in a carrier gas into a first distribution point of said deposition chamber wherein said first distribution point is located above said heating assembly and said substrate;

decomposing said HCD source gas using a thermal energy source; and forming said silicon comprising film on said substrate.

14. A process of forming a silicon comprising film as in claim 13, further comprising:

introducing an oxidation source gas into a second distribution point of said deposition chamber wherein said second distribution point is located above said heating assembly and said substrate;

decomposing said HCD source gas and said oxidation source gas using said thermal energy source; and wherein said silicon comprising film being formed on said substrate is a silicon oxide film.

15. A process of forming a silicon comprising film as in claim 13 further comprising:

introducing a nitridation source gas into a third distribution point of said deposition chamber wherein said third distribution point is located above said heating assembly and said substrate;

decomposing said HCD source gas and said nitridation source gas using said thermal energy source; and wherein said silicon comprising film being formed on said substrate is a silicon nitride film.

16. A process of forming a silicon comprising film as in claim 15 further comprising:
   treating said silicon nitride film with said nitridation source gas after said silicon nitride film is formed.

17. A process of forming a silicon comprising film as in claim 13 further comprising:
   introducing an oxidation source gas into a second distribution point of said deposition chamber wherein said second distribution point is located above said heating assembly and said substrate;
   introducing a nitridation source gas into a third distribution point of said deposition chamber wherein said third distribution point is located above said heating assembly and said substrate; and
   decomposing said HCD source gas, said oxidation source gas, and said nitridation source gas using said thermal energy source; and wherein
   said silicon comprising film being formed on said substrate is a silicon-oxynitride film.

18. A process of forming a silicon comprising film as in claim 17 further comprising:
   treating said silicon-oxynitride film with said nitridation source gas after said silicon-oxynitride film is formed.

19. A process of forming a silicon comprising film comprising:
   placing a substrate in a deposition chamber;
   said deposition chamber further includes a water passage to create a cold-wall deposition chamber, a temperature-controlled liner inside said deposition chamber to prevent unwanted condensation of reactant species, and a resistively heating assembly to heat up said substrate wherein said substrate is horizontally placed in said deposition chamber;
   introducing a HCD source gas diluted in a carrier gas into a first distribution point of said deposition chamber wherein said first distribution point is located above said heating assembly and said substrate;
   decomposing said HCD source gas using a thermal energy source; and
   forming said silicon comprising film on said substrate;
   introducing an oxidation source gas into a second distribution point of said deposition chamber wherein said second distribution point is located above said heating assembly and said substrate;
   decomposing said HCD source gas and said oxidation source gas using said thermal energy source; and wherein
   said silicon comprising film being formed on said substrate is a silicon oxide film; and
   treating said silicon oxide film with said oxidation source gas after said silicon oxide film is formed.

20. A process of forming a silicon comprising film comprising:
   placing a substrate in a deposition chamber, said deposition chamber further includes a water passage to create a cold-wall deposition chamber, a temperature-controlled liner inside said deposition chamber to prevent unwanted condensation of reactant species, and a resistively heating assembly to heat up said substrate wherein said substrate is horizontally placed in said deposition chamber;
   forming a silicon oxide film on said substrate by introducing a HCD gas diluted in a carrier gas and an oxidation gas into said deposition chamber, and by decomposing said HCD gas and said oxidation gas using a thermal energy, said HCD gas being introduced into a first distribution point located above said heating assembly and said substrate, said oxidation gas being introduced into a second distribution point located above said heating assembly and said substrate;
   forming a silicon oxynitride film on said silicon film after said silicon oxide film is formed by introducing a nitridation gas into said deposition chamber while continuing said introducing of said HCD gas and said oxidation gas, and by decomposing said HCD gas and said oxidation gas and said nitridation gas using said thermal energy, said nitridation gas being introduced into a third distribution point located above said heating assembly and said substrate; and
   forming a silicon nitrided film on said silicon oxynitride film after said silicon oxynitride film is formed by cutting off flow of said oxidation gas while continuing said introducing of said HCD gas and said nitridation gas, and by decomposing said HCD gas and said nitridation gas using said thermal energy; and
   wherein said silicon oxide film, said silicon oxynitride film, and said silicon nitride film are formed sequently in said deposition chamber under a process temperature ranging from about 500° C. to about 800° C. and a process pressure ranging from about 10 to about 350 Torr.

* * * * *